US008871617B2

(12) United States Patent
Pore et al.

(10) Patent No.: US 8,871,617 B2
(45) Date of Patent: Oct. 28, 2014

(54) DEPOSITION AND REDUCTION OF MIXED METAL OXIDE THIN FILMS

(75) Inventors: Viljami J. Pore, Helsinki (FI); Eva Tois, Helsinki (FI)

(73) Assignee: ASM IP Holding B.V. (NL)

( * ) Notice: Subject to any disclaimer, the term of this patent is extended or adjusted under 35 U.S.C. 154(b) by 0 days.

(21) Appl. No.: 13/416,921

(22) Filed: Mar. 9, 2012

(65) Prior Publication Data

US 2012/0302055 A1    Nov. 29, 2012

Related U.S. Application Data

(60) Provisional application No. 61/478,214, filed on Apr. 22, 2011, provisional application No. 61/485,532, filed on May 12, 2011, provisional application No. 61/526,607, filed on Aug. 23, 2011.

(51) Int. Cl.
*H01L 21/20* (2006.01)
*H01L 21/285* (2006.01)
*C23C 16/40* (2006.01)
*C23C 16/06* (2006.01)
*C23C 16/455* (2006.01)
*H01L 29/78* (2006.01)
*H01L 29/66* (2006.01)
*H01L 29/49* (2006.01)
*H01L 29/45* (2006.01)

(52) U.S. Cl.
CPC .... *H01L 21/28518* (2013.01); *H01L 21/28562* (2013.01); *H01L 29/4933* (2013.01); *C23C 16/406* (2013.01); *C23C 16/06* (2013.01); *C23C 16/45527* (2013.01); *H01L 29/456* (2013.01); *H01L 29/7827* (2013.01); *H01L 29/665* (2013.01); *H01L 29/66666* (2013.01)

USPC .......... 438/509; 438/478; 438/481; 438/608; 427/255.19; 117/84

(58) Field of Classification Search
None
See application file for complete search history.

(56) References Cited

U.S. PATENT DOCUMENTS

| | | | | |
|---|---|---|---|---|
| 5,996,048 | A | * | 11/1999 | Cherabuddi et al. .......... 711/122 |
| 5,998,048 | A | * | 12/1999 | Jin et al. ..................... 428/836.3 |
| 6,921,712 | B2 | | 7/2005 | Soininen et al. |
| 7,105,054 | B2 | | 9/2006 | Lindfors |

(Continued)

FOREIGN PATENT DOCUMENTS

WO    WO 2011/056519    5/2011

OTHER PUBLICATIONS

Aaltonen et al., "Atomic Layer Deposition of Platinum Thin Films", Chem. Mater., 2003, vol. 15, pp. 1924-1928.

(Continued)

*Primary Examiner* — Julio J Maldonado
*Assistant Examiner* — Joseph Galvin, III
(74) *Attorney, Agent, or Firm* — Knobbe, Martens Olson & Bear, LLP

(57) ABSTRACT

In one aspect, methods of forming mixed metal thin films comprising at least two different metals are provided. In some embodiments, a mixed metal oxide thin film is formed by atomic layer deposition and subsequently reduced to a mixed metal thin film. Reduction may take place, for example, in a hydrogen atmosphere. The presence of two or more metals in the mixed metal oxide allows for reduction at a lower reduction temperature than the reduction temperature of the individual oxides of the metals in the mixed metal oxide film.

40 Claims, 11 Drawing Sheets

(56) References Cited

U.S. PATENT DOCUMENTS

| | | | |
|---|---|---|---|
| 7,220,669 B2* | 5/2007 | Hujanen et al. | 438/650 |
| 7,238,595 B2 | 7/2007 | Brabant et al. | |
| 7,241,677 B2 | 7/2007 | Soinenen et al. | |
| 7,329,593 B2 | 2/2008 | Bauer et al. | |
| 7,771,533 B2 | 8/2010 | Tois et al. | |
| 7,771,534 B2 | 8/2010 | Tois et al. | |
| 7,824,492 B2 | 11/2010 | Tois et al. | |
| 7,927,942 B2 | 4/2011 | Raaijmakers | |
| 8,152,922 B2 | 4/2012 | Schmidt et al. | |
| 2006/0141155 A1 | 6/2006 | Gordon et al. | |
| 2007/0004203 A1 | 1/2007 | Streck et al. | |
| 2008/0171890 A1 | 7/2008 | Kim et al. | |
| 2009/0197411 A1 | 8/2009 | Dussarrat et al. | |
| 2009/0214767 A1 | 8/2009 | Wang et al. | |
| 2009/0315120 A1 | 12/2009 | Shifren et al. | |
| 2010/0155859 A1* | 6/2010 | Raaijmakers | 257/412 |
| 2010/0193951 A1 | 8/2010 | Dussarrat et al. | |
| 2011/0014400 A1* | 1/2011 | Huang et al. | 427/597 |
| 2011/0104906 A1 | 5/2011 | Tois et al. | |
| 2011/0269310 A1 | 11/2011 | Raaijmakers | |

OTHER PUBLICATIONS

Aaltonen et al., "Reaction Mechanism Studies on Atomic Layer Deposition of Ruthenium and Platinum", Electrochemical and Solid-State Letters, 2003, vol. 6, No. 9, pp. C130-C133.

Addison et al., The vapour pressure of anhydrous copper nitrate, and its molecular weight in the vapour state, J. Chem. Soc., 1958, pp. 3099-3106.

Bahlawane et al., "Alcohol-Assisted CVD of Silver Using Commercially Available Precursors", Chem. Vap. Deposition, 2007, vol. 13, pp. 401-407.

Bahlawane et al., "Nickel and Nickel-Based Nanoalloy Thin Films from Alcohol-Assisted Chemical Vapor Deposition", Chem. Mater, 2010, vol. 22, pp. 92-100.

Bahlawane et al., "Self-catalyzed chemical vapor deposition method for the growth of device-quality metal thin films", Microelectronic Engineering, 2007, vol. 84, pp. 2481-2485.

Bahlawane et al., "Catalytically enhanced $H_2$-free CVD of transition metals using commercially available precursors", Surface & Coatings Technology, 2007, vol. 201, pp. 8914-8918.

Chae et al., "Atomic Layer Deposition of Nickel by the Reduction of Preformed Nickel Oxide", Electrochemical and Solid-State Letters, 2002, vol. 5, No. 6, pp. C64-C66.

Daub et al., "Ferromagnetic Nanostructures by Atomic Layer Deposition: From Thin Films towards Core-shell Nanotubes", ECS Transactions, 2007, vol. 11, No. 7, pp. 139-148.

Fereday et al., Anhydrous Cobalt(III) Nitrate, Chemical Communications, 1968, p. 271.

Gaudet et al., Reaction of thin Ni films with Ge: Phase formation and texture, Journal of Applied Physics, 2006, vol. 100, Issue 3, p. 034306.

Hamalainen et al., Atomic Layer Deposition of Platinum Oxide and Metallic Platinum Thin Films from Pt(acac)2 and Ozone, Chem. Mater., 2008, vol. 20, Issue 21, pp. 6840-6846.

Kim et al., Atomic Layer Deposition of Ni Thin Films and Application to Area-Selective Deposition, Journal of the Electrochemical Society, 2011, vol. 158, Issue 1, pp. D1-D5.

Knoops et al., "Remote Plasma and Thermal ALD of Platinum and Platinum Oxide Films", ECS Transactions, 2008, vol. 16, No. 4, pp. 209-218.

Lavela et al., CoFe2O4 and NiFe2O4 synthesized by sol-gel procedures for their use as anode materials for Li ion batteries, Journal of Power Sources, Oct. 11, 2007, vol. 172, Issue 1, pp. 379-387.

Lavoie et al., "Towards implementation of a nickel silicide process for CMOS technologies", Microelectronic Engineering, 2003, vol. 70, pp. 144-157.

Lee et al., "Interface Properties of Nickel—silicide Films Deposited by Using Plasma-assisted Atomic Layer Deposition", Journal of the Korean Physical Society, 2009, vol. 55, No. 3, pp. 11-53-1157.

Lee et al., "On the Ni—Si phase transformation with/without native oxide", Microelectronic Engineering, 2000, vol. 51-52, pp. 583-594.

Lee et al., "Synthesis of Novel Platinum Precursor and Its Application to Metal Organic Chemical Vapor Deposition of Platinum Thin Films", Bull. Korean Chem. Soc., 2008, vol. 29, No. 8, pp. 1491-1494.

Lim et al., Atomic layer deposition of transition metals, Nature Materials, Nov. 2003, vol. 2, pp. 749-754.

Pore et al., Atomic Layer Deposition of Antimony and its Compounds Using Dechlorosilylation Reactions of Tris(triethylsilyl)antimony, Chem. Mater., 2011, vol. 23, Issue 2, pp. 247-254.

Premkumar et al., CVD of Metals Using Alcohols and Metal Acetylacetonates, Part I: Optimization of Process Parameters and Electrical Characterization of Synthesized Films, Chem. Vap. Deposition, 2007, vol. 13, 219-226.

Premkumar et al., CVD of Metals Using Alcohols and Metal Acetylacetonates, Part II: Role of Solvent and Characterization of Metal Films Made by Pulsed Spray Evaporation CVD, Chem. Vap. Deposition, 2007, vol. 13, 227-231.

Premkumar et al., Effect of Solvent on the Growth of Co and $Co_2$ Using Pulsed-Spray Evaporation Chemical Vapor Deposition, Chem. Mater., 2007, vol. 19, 6206-6211.

Rodriguez et al., Experimental and Theoretical Studies on the Reaction of H2 with NiO: Role of O Vacancies and Mechanism for Oxide Reduction, J. Am. Chem. Soc., 2002, vol. 124, Issue 2, pp. 346-354.

Rodriguez et al., Reduction of CuO in H2: in situ time-resolved XRD studies, Catalysis Letters, Feb. 2003, vol. 85, Issue 3-4, pp. 247-254.

Rooth et al., "Atomic Layer Deposition of Iron Oxide Thin Films and Nanotubes using Ferrocene and Oxygen as Precursors", Chem. Vap. Deposition, 2008, vol. 14, 67-70.

Satyanarayana et al., Nanosized spinel NiFe2O4: A novel material for the detection of liquefied petroleum gas in air, Materials Chemistry and Physics, Sep. 28, 2003, vol. 82, Issue 1, pp. 21-26.

Scheffe et al., "Atomic layer deposition of iron(III) oxide on zirconia nanoparticles in a fluidized bed reactor using ferrocene and oxygen", Thin Solid Films, 2009, vol. 517, pp. 1874-1879.

Tomitaka et al., Magnetic characterization and self-heating of various magnetic nanoparticles for medical applications, Nanoelectronics Conference (INEC), 2010 3rd International, Jan. 3-8, 2010, pp. 896-897.

Utriainen et al., Studies of metallic thin film growth in an atoic layer epitaxy reactor using M(acac)2 (M=Ni, Cu, Pt) precursors, Applied Surface Science, 2000, vol. 157, pp. 151-158.

Utriainen et al., Studies of NiO thin film formation by atomic layer epitaxy, Materials Science and Engineering, 1998, vol. B54, pp. 98-103.

Wong et al., International Symposium on VLSI Technology, Systems and applications (VLSI-TSA), Apr. 21-23, 2008, pp. 36-37, Hsinchu, Taiwan.

\* cited by examiner

DEPOSITION AND REDUCTION OF MIXED METAL OXIDE THIN FILMS

REFERENCE TO RELATED APPLICATIONS

The present application claims priority to U.S. provisional application No. 61/526,607, filed Aug. 23, 2011, U.S. provisional application No. 61/485,532, filed May 12, 2011 and U.S. provisional application No. 61/478,214, filed Apr. 22, 2011, each of which is hereby incorporated by reference in its entirety.

BACKGROUND OF THE INVENTION

1. Field of the Invention

The invention relates generally to the field of semiconductor device manufacturing and, more particularly, to methods for forming metal films by depositing and reducing metal oxide films comprising two different metals.

2. Description of the Related Art

In forming advanced semiconductor devices, metal films are used in a variety of contexts. For example, metal alloys such as nickel-iron alloys can be used in the magnetic heads of hard disk drives. Typically the Ni/Fe alloys are deposited by PVD methods. However, future device designs call for conformal deposition of the magnetic layers. Thus, more conformal vapor deposition processes, such as chemical vapor deposition (CVD) and atomic layer deposition (ALD) will be used in place of the physical methods.

In another application, metal films are used in the formation of silicides to be used as electrical contacts in integrated circuits. Typically silicides are formed by depositing a metal by a PVD method on top of silicon and annealing to induce a solid state reaction. Part of the silicon that is present in gate, source and drain structures can be converted into low-resistivity metal silicides. This is done to realize a conductive path with a low bulk resistivity on the one hand, and to ensure a good contact resistance on the other hand. In the past, $TiSi_2$ was used for this process; then later $CoSi_2$ was the silicide of choice for the most advanced devices. As both $TiSi_2$ and $CoSi_2$ consume a relatively large amount of silicon, there has been a switch to using $NiSi_x$ to form these conductive paths. This silicide combines a low bulk resistivity with a relatively low amount of silicon consumption. In advanced devices, a second metal, such as Pt, is sometimes added to improve properties of the silicide, such as microstructure and thermal stability.

In these and other contexts, ALD would be beneficial for deposition in high aspect ratio structures. However, commercially viable methods for depositing many elemental metals have not been available. On the other hand, ALD processes for depositing metal oxides of these same metals may be known. Thus, one approach to forming metals has been to deposit metal oxides by ALD and subsequently reduce them to the desired elemental metal. However, there is a need for improved processes, such as processes that can be carried out at reduced temperatures.

SUMMARY OF THE INVENTION

In one aspect, metallic films comprising two different metals can be formed on a substrate by depositing a mixed metal oxide comprising a first metal and a second metal on the substrate using a vapor deposition process. The mixed metal oxide is reduced by heating, for example in a hydrogen atmosphere, to form the metallic film. In some embodiments the metal oxide comprises a greater concentration of the first metal than the second metal.

In some embodiments the first metal is selected from the group consisting of Ni, Fe, Co, Cu, Ag, Cr, V, Mn, Zn, Sn, Pb, Bi, In and Cd. The second metal is selected from the group consisting of Pt, Ni, Pd, Rh, Ru and Co.

In some embodiments the hydrogen atmosphere comprises $H_2$. In some embodiments the hydrogen atmosphere comprises hydrogen plasma, hydrogen radicals and/or hydrogen atoms.

Reduction may take place at a temperature that is less than the reduction temperature of the individual oxide of the first metal. In some embodiments the mixed metal oxide is $PtNiO_x$ and reduction is carried out by heating to a temperature of about 150° C. to about 175° C. In some embodiments the mixed metaloxide is $NiFe_2O_4$ and reduction is carried out by heating to a temperature of less than about 300° C.

In some embodiments the vapor deposition process is an atomic layer deposition (ALD) process. The ALD process may comprise two sub-cycles: a first sub-cycle for forming an oxide of the first metal and a second sub-cycle for forming an oxide of the second metal. In some embodiments the second sub-cycle forms elemental second metal, or a mixture of elemental second metal and oxide of the second metal. The sub-cycles are repeated a predetermined number of times and at a predetermined ratio to deposit a mixed metal oxide of the desired composition and thickness.

In another aspect, methods for silicidation are provided in which a mixed metal oxide thin film is formed on a substrate comprising at least one exposed silicon region. The mixed metal oxide film comprises a first metal and second metal that is different from the first metal. The first metal usually has a greater concentration than the second metal in the mixed metal oxide film. In some embodiments the mixed metal oxide film is formed by at least one complete cycle of an atomic layer deposition process, wherein one complete cycle comprises contacting the substrate with a first metal source, a first oxygen source, a second metal source and a second oxygen source. The mixed metal oxide film is subsequently reduced to a metallic film by heating in a hydrogen atmosphere. Annealing may be performed subsequently or simultaneously with the reduction to form a metal silicide layer comprising the first and second metals.

In another aspect, methods of forming a metallic film comprising nickel and iron are provided, wherein a mixed metal oxide comprising nickel and iron is deposited on a substrate by a vapor deposition process and subsequently reduced in a hydrogen atmosphere at a temperature of less than about 300° C., less than about 250° C. or less than about 150° C. In some embodiments the hydrogen atmosphere comprises $H_2$. In some embodiments the deposition process is an atomic layer deposition process. In some embodiments the mixed metal oxide is $NiFe_2O_4$.

In another aspect methods are provided for forming a mixed metal layer comprising nickel and platinum. The methods comprise depositing a nickel platinum oxide film by a vapor deposition process and reducing the nickel platinum oxide film at a temperature of less than about 200° C. in a hydrogen atmosphere. In some embodiments the nickel platinum oxide film comprises about 40% to about 60% platinum.

BRIEF DESCRIPTION OF THE DRAWINGS

The invention will be better understood from the detailed description of the preferred embodiments and from the appended drawings, which are meant to illustrate and not to limit the invention, and wherein.

DETAILED DESCRIPTION OF THE PREFERRED EMBODIMENT

Figure 1:
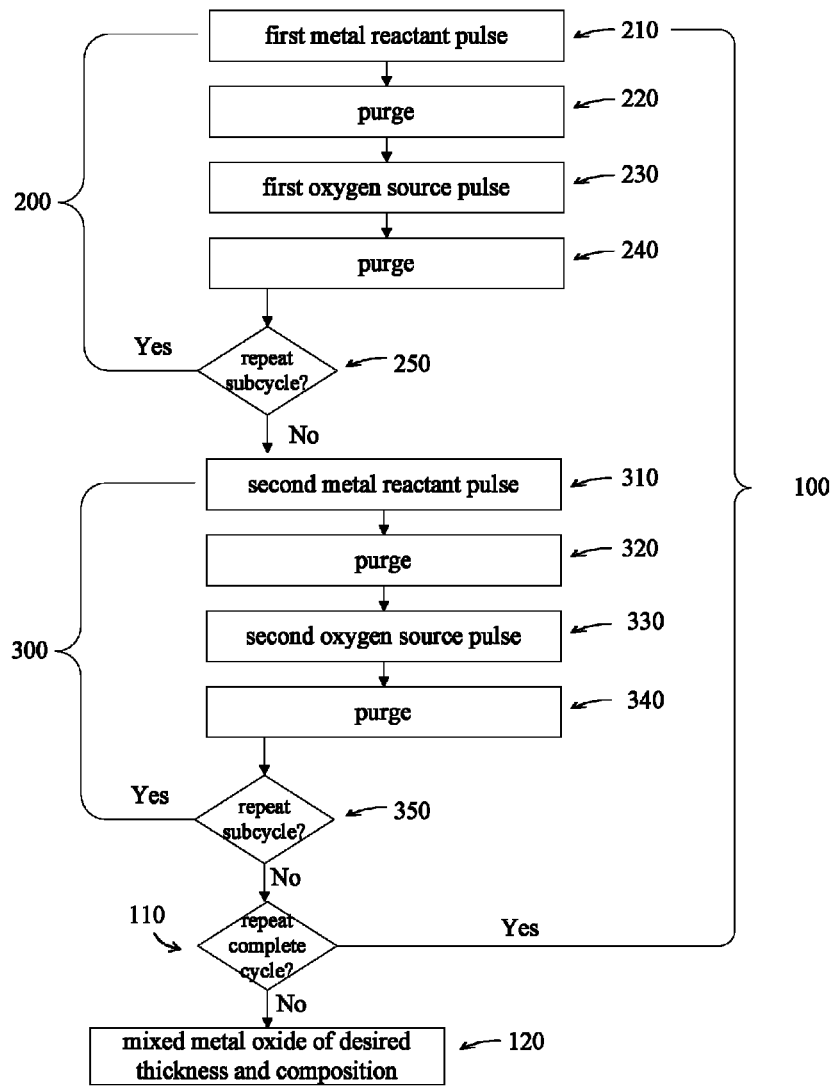
FIG. 1 is a flow chart illustrating an ALD process for forming mixed metal oxide films.

In some situations it is beneficial to form thin metal films by depositing a metal oxide and subsequently reducing the metal oxide to metal. This technique has been used, for example, to form metal thin films by atomic layer deposition (ALD) in cases where commercially acceptable processes for depositing the metal directly are not available. The present application is based, in part, on the unexpected finding that in some situations reduction of certain metal oxides comprising two different metals (mixed metal oxides) can be carried out at lower temperatures than reduction of the individual oxides of the metals. Thus, in some embodiments, the reduction temperature of a metal oxide thin film is reduced by addition of one or more additional, different metals in the metal oxide.

In some embodiments a mixed metal oxide is reduced in the presence of hydrogen. Without wishing to be held to any theory, Applicants believe that the decreased reduction temperature required in the presence of hydrogen may result from the ability of one of the two metals in the mixed metal oxide to dissociate molecular hydrogen.

In some embodiments, methods of forming a metallic film comprise depositing a mixed metal oxide, the mixed metal oxide comprising a first and second metal, where the second metal is different from the first metal, and where the mixed metal oxide comprises a greater concentration of the first metal than the second metal. The mixed metal oxide film is then reduced to form the metallic film. In some embodiments the mixed metal oxide film is not a nanolaminate film or a film in which distinct and separate layers of metal oxides are observable.

The first metal and second metal are selected such that the reduction temperature of a mixed metal oxide comprising a greater concentration of the first metal than the second metal is lower than the reduction temperature of an oxide of the first individual metal. The reduction temperature for this comparison is the temperature at which an equivalent or greater amount of reduction, for example >90% reduction, >95% reduction, >99% reduction or >99.9% reduction is obtained in a given amount of time in $H_2$ at an equivalent pressure. The amount of reduction in a certain time scale can be measured by measuring the metal to oxygen atomic ratio (or vice versa) in the film, with reliable quantitative analysis like RBS and ERDA. Preferably the time scale for measuring the amount of reduction is less than 60 minutes. In some embodiments the amount of reduction is measured in 30 minutes or less and in some embodiments the amount of reduction is measured in 20 minutes or less or even in some cases in less than 10 minutes for films having thickness less than 50 nm. Thus, the temperature at which at least a given amount of reduction of the mixed metal oxide is obtained in a given amount of time in a $H_2$ atmosphere is less than the temperature at which an equivalent amount of reduction of the individual metal oxide of the first metal would be obtained in an equivalent $H_2$ atmosphere (under equivalent conditions) in the given time, where the first metal is the only metal in the first metal oxide. In some embodiments the given time can be 1, 5, 10, 15, 20, 30, 45 or 60 minutes.

In some embodiments the temperature at which a film of the mixed metal oxide having a thickness of approximately 25 nm is 90% reduced in 10 minutes in a $H_2$ atmosphere at a pressure of 10 mbar is less than the temperature at which a film of the individual oxide of the first metal having a thickness of approximately 25 nm is 90% reduced in 10 minutes in a $H_2$ atmosphere at a pressure of 10 mbar.

In some embodiments the reduction temperature can also be lower than the reduction temperature of the second individual metal oxide under equivalent conditions, where the only metal in the second metal oxide is the second metal. In some embodiments the temperature at which the mixed metal oxide comprising the first and second metal is reduced to the metallic film is lower than the temperature at which either individual metal oxide would be reduced an equivalent amount, under otherwise equivalent conditions. In some embodiments the temperature at which the mixed metal oxide comprising the first and second metal is reduced to the metallic film is lower than the temperature at which either individual metal oxide would be reduced to the respective metals in a given amount of time in a hydrogen atmosphere at equivalent pressure.

In some embodiments the temperature at which the mixed metal oxide is reduced is more than 10° C., more than 20° C., more than 25° C., more than 30° C., more than 50° C., more than 75° C. or even more than 100° C. less than the reduction temperature of an oxide of the first metal, an oxide of the second metal, or both individual metal oxides.

In some embodiments the concentration of the first metal in the deposited mixed metal oxide is greater than the concentration of the second metal. In some embodiments the ratio of the second metal to the first metal is less than about 1:1, less that about 1:2, less than about 1:3, less than about 1:4, less than about 1:5, less than about 1:10, less than about 1:20, Less than about 1:50, less than about 1:75 or less than about 1:100. In some embodiments the second metal comprises less than about 50%, less than about 40%, less than about 30%, less than about 20%, less than about 10%, less than about 5%, less than about 4%, less than about 3%, less than about 2% or even less than about 1% of the total of the first and second metal in the mixed metal oxide.

The concentration of the first and second metals can be varied to change the reduction temperature. For example, the concentration of the second metal can be increased relative to the first metal to decrease the reduction temperature or to decrease the reduction time or to decrease the reducing agent concentration, for example, to levels, which are considered to be safe, for example, below lower explosive limit (LEL)

In some embodiments the first metal is selected from the group consisting of Ni, Fe, Co, Cu, Ag, Cr, V, Mn, Zn, Sn, Pb, Bi, In and Cd. In some embodiments the first metal is selected from the group consisting of Ni, Fe, Co and Cu. In some embodiments the second metal is selected from the group consisting of Pt, Ni, Pd, Rh, Ru, and Co. In some embodiments the second metal is selected from the group consisting of Pt and Ni. In some embodiments the second metal is selected from the group consisting of Ru and Pd.

In some embodiments the first metal is selected from the group consisting of Ni, Fe, Co, Cu, Ag, Cr, V, Mn, Zn, Sn, Pb, Bi, In and Cd and the second metal is selected from the group consisting of Pt, Ni, Pd, Rh, Ru, and Co.

In some embodiments the first metal is selected from the group consisting of Co and Cu and the second metal is selected from the group consisting of Pd and Ru.

In some embodiments the first metal is selected from the group consisting of Ni and Fe and the second metal is selected from the group consisting Pt or Ru.

In some embodiments the first metal is Ni and the second metal is Pt. In some embodiments the first metal is Fe and the second metal is Ni.

In some embodiments the mixed metal oxide comprises a higher concentration of a first metal is selected from the group consisting of Ni, Fe, Co, Cu, Ag, Cr, V, Mn, Zn, Sn, Pb, Bi, In and Cd and a lower concentration of a second metal is selected from the group consisting of Pt, Ni, Pd, Rh, Ru, and Co.

As mentioned above, the first metal is preferably different from the second metal. For example, if the first metal is Ni, the second metal is not Ni and if the first metal is Co the second metal is not Co.

In some embodiments the mixed metal oxide is reduced in an atmosphere comprising hydrogen. For example, in some embodiments the mixed metal oxide is reduced in a $H_2$ atmosphere. In some embodiments the mixed metal oxide is reduced in an atmosphere comprising hydrogen plasma. In some embodiments the mixed metal oxide is reduced in an atmosphere comprising hydrogen atoms or radicals. In some embodiments the mixed metal oxide is reduced in an atmosphere comprising hydrazine ($N_2H_4$). In some embodiments the mixed metal oxide is reduced in an atmosphere comprising one or more reactive organic compounds, which contain at least one functional group selected from the group of alcohol (—OH), aldehyde (—CHO), and carboxylic acid (—COOH).

As noted above, processes described herein enable use of vapor deposition techniques to form conformal metallic layers, such as chemical vapor deposition (CVD) or atomic layer deposition (ALD). The metallic layers may find use in a variety of contexts. For example, thin metallic films such as nickel-iron alloys may be used in hard disk mass storage devices, as anodes for lithium ion batteries, as sensors, or for medical applications. In some embodiments the metallic layers may be formed over silicon and subsequent annealing carried out to form metal silicides. In such cases, the mixed metal may not only be deposited at lower temperatures, but may also provide improved silicide properties, such as microstructure and thermal stability.

Atomic Layer Deposition (ALD)

ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant byproducts from the reaction chamber between reactant pulses.

Briefly, a substrate is loaded into a reaction chamber and is heated to a suitable deposition temperature, generally at lowered pressure. Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved.

A first reactant is conducted into the chamber in the form of vapor phase pulse and contacted with the surface of a substrate, typically comprising a three dimensional structure. Conditions are preferably selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as when depositing layers over extremely high aspect ratio structures or other structures with complex surface morphology is needed. The appropriate pulsing times can be readily determined by the skilled artisan based on the particular circumstances.

A second gaseous reactant is pulsed into the chamber where it reacts with the first reactant bound to the surface. Excess second reactant and gaseous by-products of the surface reaction are purged out of the reaction chamber, preferably with the aid of an inert gas. The steps of pulsing and purging are repeated until a thin film of the desired thickness has been formed on the substrate, with each cycle leaving no more than a molecular monolayer. As discussed in detail below, in forming mixed metal oxides, a second deposition cycle is repeated one or more times to contribute a second metal to the growing film.

Additional reactants can also be supplied that, in some embodiments, do not contribute elements to the growing film. Such reactants can be provided either in their own pulses or along with precursor pulses, and can be used for example to provide a desired surface termination, or to strip or getter adhered ligands and/or free by-product.

Additionally, not all cycles need to be identical. For example, as described below a metal oxide film can be doped with a second, different metal or metal oxide, by addition of a second metal or metal oxide deposition cycle at a desired frequency, e.g., every fifth primary cycle in order to control stoichiometry of the deposited metal oxide and the ultimate metallic film, and the frequency can change during the deposition in order to grade film composition.

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed.

Examples of suitable reactors that may be used include commercially available ALD equipment such as the F-120® reactor, Pulsar® reactor and Advance® 400 Series reactor, available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used. Preferably, reactants are kept separate until reaching the reaction chamber, such that shared lines for the precursors are minimized. However, other arrangements are possible, such as the use of a pre-reaction chamber as described in U.S. application Ser. No. 10/929,348, filed Aug. 30, 2004 and Ser. No. 09/836,674, filed Apr. 16, 2001, the disclosures of which are incorporated herein by reference.

The metal oxide ALD processes described below can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

Mixed Metal Oxide Deposition by ALD

According to some embodiments, a mixed metal oxide thin film is formed by an atomic layer deposition process. In some embodiments the mixed metal oxide is deposited by an atomic layer deposition (ALD) type process comprising multiple complete mixed oxide ALD cycles. Each complete mixed oxide ALD cycles comprises a first deposition sub-cycle for forming up to a monolayer of a first material comprising a first metal and a second deposition sub-cycle for forming up to a monolayer of a second material comprising a second metal. The number of first deposition sub-cycles and second deposition sub-cycles in each complete ALD cycle are varied to achieve the desired composition. Further, the number of complete ALD cycles is varied to deposit a mixed oxide with the desired thickness.

As discussed above, the first metal and second metal are preferably different. The second metal content can be expressed as a ratio or percentage of the overall metal content in the film, e.g. second metal/(first metal+second metal). For example, in a mixed metal oxide film comprising Ni and Pt, the Pt content can be expressed as Pt/(Pt+Ni). In some embodiments the second metal is about 0-10%, 0-20% or about 0-50% of the total metal in the mixed metal oxide.

In some embodiments, each deposition sub-cycle comprises alternately and sequentially contacting the substrate with a metal precursor and an oxidizing compound. Thus, the material deposited in the first and second deposition sub-cycles is typically a metal oxide. However, the composition of the films depends, in part, on the nature of the reactants and the temperature. In some embodiments the material deposited may be an elemental metal or a mixture of an elemental metal and its oxide. For example, in some embodiments metallic platinum may be deposited in a first or second deposition sub-cycle using a platinum precursor and an oxidizing reactant at a particular temperature.

In some embodiments the first and second deposition sub-cycles are performed at the same reaction temperature. In some embodiments, the first and second deposition sub-cycles are performed in the same reactor.

The first and second deposition sub-cycles are provided at a selected ratio to deposit a mixed metal oxide film with a desired ratio of the second metal to the first metal. For example, in some embodiments the ratio of the second deposition sub-cycle to the first deposition sub-cycle in the complete ALD process may be about 1:100, about 1:75, about 1:50, about 1:20, about 1:10, about 1:6, about 1:5, about 1:4, about 1:2 or about 1:1. In some embodiments the ratio of the second deposition sub-cycle to the first deposition sub-cycle in each complete ALD cycle may be about 1:100, about 1:75, about 1:50, about 1:20, about 1:10, about 1:6, about 1:5, about 1:4, about 1:2 or about 1:1. In some embodiments the ratio of first deposition sub-cycles to second deposition sub-cycles is the same in all of the complete ALD cycles performed in the ALD process. In other embodiments the specific ratio of first deposition sub-cycles to second deposition sub-cycles can be varied in different complete ALD cycles. The specific ratios can be selected by the skilled artisan to provide the desired amounts of the first and second metal in the metallic film after reduction.

It follows that in some embodiments the ALD process will comprise more of the first deposition sub-cycles than the second deposition sub-cycles. Thus, the mixed metal oxide that is formed will comprise more of the first metal than the second metal. In some embodiments at least 80%, at least 85%, at least 90%, at least 95%, at least 97%, at least 98%, at least 99% or at least 99.5% of the metal in the mixed metal oxide is the first metal. In some embodiments about 30-80%, or about 40-60% of the metal in the mixed metal oxide is the second metal.

In some embodiments, as illustrated in FIG. 1, a complete mixed metal oxide ALD cycle 100 comprises a first deposition sub-cycle 200 and a second deposition sub-cycle 200. The first deposition sub-cycle comprises:
pulsing a vaporized first metal precursor comprising a first metal into the reaction chamber 200 to form at most a molecular monolayer of first metal precursor on the substrate,
purging the reaction chamber 220 to remove excess metal precursor and reaction by products, if any,
providing a pulse of a first oxygen source 230 onto the substrate, where the oxygen source reacts with the first metal precursor on the substrate,
purging the reaction chamber 240 to remove excess first oxygen reactant and any gaseous by-products formed in the reaction between the metal precursor layer on the first surface of the substrate and the first oxygen reactant, and
repeating 250 the pulsing and purging steps until a first metal oxide thin film of the desired thickness has been formed.

In some embodiments, the first deposition sub-cycle is repeated 1, 2, 3, 4, 5, 10, 20, 50, 100 or more times in succession.

The atomic layer deposition process 100 for forming the mixed metal oxide also comprises one or more second deposition sub-cycles 300. In some embodiments, the second deposition sub-cycle 300 comprises:

pulsing a vaporized second metal precursor 310 comprising a second metal into the reaction chamber to form at most a molecular monolayer of second metal precursor on the substrate, purging the reaction chamber 320 to remove excess second metal precursor and reaction by products, if any, providing a pulse of a second oxygen source 330 onto the substrate, where the oxygen source reacts with the second metal precursor on the substrate, purging the reaction chamber 340 to remove excess second oxygen precursor and any gaseous by-products formed in the reaction between the second metal precursor layer on the first surface of the substrate and the second oxygen reactant, and repeating 350 the pulsing and purging steps until a second metal oxide thin film of the desired thickness has been formed.

In some embodiments, the second deposition sub-cycle 300 is repeated 1, 2, 3, 4, 5, 10, 20, 50, 100 or more times in succession.

The first and second deposition sub-cycles 200,300 are repeated a predetermined number of times in a complete ALD cycle 100, and the complete ALD cycle 100 is repeated 110 to form a mixed metal oxide of a desired thickness 120 comprising a desired concentration of the first and second metals.

In some embodiments, the number of times the first deposition sub-cycle 200 and second deposition sub-cycle 300 are repeated is the same in each complete ALD cycle 100. In other embodiments, the number of first and second deposition sub-cycles 100, 200 varies in one or more complete ALD cycles 100. The number of first and second sub-cycles 100, 200 in each complete ALD cycle 100 and the total number of first and second sub-cycles 100, 200 and total ALD cycles 100 can be adjusted to achieve deposition of a mixed metal oxide film of a desired thickness and composition.

In some embodiments the first and second metals are different. In some embodiments the first and second oxygen sources are the same, while in other embodiments the first and second oxygen sources are different.

In some embodiments, each first and/or second deposition sub-cycle forms at most a monolayer of a metal oxide. In some embodiments, at least one of the first or second sub-cycles forms at most a monolayer of an elemental metal or a mixture of an elemental metal and a metal oxide.

Although illustrated as beginning with the first deposition sub-cycle 100, each complete ALD cycle may begin and end with either the first or second deposition sub-cycle. For example, the growth of the mixed metal oxide can be started with the deposition of a first metal oxide using the first deposition sub-cycle and growth can be ended with the deposition of a second metal oxide using the second deposition sub-cycle. In some embodiments, alternating layers of metal oxides can be deposited.

As mentioned above, in some embodiments the first metal reactant comprises a metal that is selected from the group consisting of Ni, Fe, Co, Cu, Ag, Cr, V, Mn, Zn, Sn, Pb, Bi, In and Cd. Thus, in some embodiments an oxide of one of these metals is deposited in the first deposition sub-cycle. In some embodiments the second metal reactant comprises a metal that is selected from the group consisting of Pt, Ni, Pd, Rh, Ru, and Co and an oxide of one of these metals is deposited in the second deposition sub-cycle. However, in some embodiments an elemental form of the second metal is deposited in the second deposition sub-cycle, or a mixture of the elemental metal and the oxide. In some embodiments a Pt or Pt/PtO$_x$ layer is deposited by the second deposition sub-cycle. In some embodiments a Pd or Pd/PdO$_x$ layer is deposited by the second deposition sub-cycle. In some embodiments a Ru or Ru/RuO$_x$ layer is deposited by the second deposition sub-cycle. In some embodiments a Rh or Rh/RhO$_x$ layer is deposited by the second deposition sub-cycle.

In some embodiments the first deposition sub-cycle deposits an oxide comprising a first metal selected from the group consisting of Ni, Fe, Co, Cu, Ag, Cr, V, Mn, Zn, Sn, Pb, Bi, In and Cd and the second deposition sub-cycle deposits an oxide, comprising a second metal selected from the group consisting of Pt, Ni, Pd, Rh, Ru, and Co. As mentioned above, in some embodiments the first metal is different from the second metal. For example, if the first metal is Ni, the second metal is not Ni and if the first metal is Co the second metal is not Co. Moreover in some embodiments, one of the first or second deposition sub-cycles may deposit an elemental metal, such as Pt, Pd, Ru or Rh, or a mixture of elemental metal and metal oxide, such as Pt/PtOx, Pd/PdOx, Ru/RuOx or Rh/RhOx.

In some embodiments the second deposition sub-cycle may deposit a metallic film, such as a metallic film comprising Pt, Ni, Pd, Rh, Ru, or Co, by a CVD-type of process, rather than a true ALD process. For example, one or more metal precursors may be provided and decomposed on the substrate surface. In some embodiments the substrate is contacted with a metal reactant that at least partially decomposes on the substrate surface and a second reactant. The second reactant may be provided sequentially or simultaneously. For example, in some embodiments the metal precursor may be provided simultaneously with an additional precursor, such as H$_2$. In some embodiments the metal precursor may be provided sequentially with an additional precursor, such as H$_2$. In some embodiments the metal precursor may be provided sequentially with an additional precursor not comprising oxygen, such as H$_2$. In some embodiments the metal precursor, preferably comprising noble metal selected from the group consisting of, but not limited to Pt, Pd, Rh, and Ru, may be provided sequentially with an additional precursor comprising oxygen, such as O$_2$ or O$_3$. In some embodiments the metal precursor, preferably comprising noble metal selected from the group consisting of, but not limited to Pt, Pd, Rh, and Ru, may be provided simultaneously with an additional precursor comprising oxygen, such as O$_2$ and O$_3$.

Suitable metal precursors may be selected by the skilled artisan. In general, metal compounds where the metal is bound or coordinated to oxygen, nitrogen, carbon or a combination thereof are preferred. In some embodiments the metal precursors are organic compounds. More preferably betadiketonate, betadiketiminato compounds, amidinate compounds, aminoalkoxide, ketoiminate or cyclopentadienyl compounds or derivatives thereof are used. In some embodiments, X(acac)$_y$ or X(thd)$_y$ compounds are used, where X is a metal, y is generally, but not necessarily between 2 and 3 and thd is 2,2,6,6-tetramethyl-3,5-heptanedionato and acac is 2,4-pentanedionate. Some examples of suitable betadiketiminato (e.g., Ni(pda)$_2$) compounds are mentioned in U.S. Patent Publication No. 2009-0197411 A1, the disclosure of which is incorporated herein in its entirety. Some examples of suitable amidinate compounds (e.g., Ni($^i$Pr-AMD)$_2$) are mentioned in U.S. Patent Publication No. 2006-0141155 A1, the disclosure of which is incorporated herein in its entirety. Some examples of suitable aminoalkoxide compounds are mentioned in U.S. Patent Publication No. 2008-0171890 A1, the disclosure of which is incorporated herein in its entirety. Some specific metal precursors that may be used in some embodiments are provided below. Other suitable precursors can be identified by the skilled artisan based on the specific circumstances.

Volatile copper compounds may be selected, for example, from the group consisting of, but not limited to, Cu-amidinates, $Cu(thd)_2$, $Cu(acac)_2$, $Cu(hfac)_2$, CuCl, CuBr, CuI and anhydrous copper nitrate $(Cu(NO_3)_2)$ and derivatives thereof. Anhydrous $Cu(NO_3)_2$ has not been commercially available but it can easily be synthesized from copper metal and dinitrogen tetroxide in anhydrous ethyl acetate. The synthesis has been described by C. C. Addison and B. J. Hathaway, "The Vapor Pressure of Anhydrous Copper Nitrate, and its Molecular Weight in the Vapor State", J. Chem. Soc. 1958 pp. 3099-3106, the disclosure of which is included herein by reference.

Volatile cobalt compounds may be selected, for example, from the group consisting of, but not limited to, tris(2,2,6,6-tetramethyl-3,5-heptanedionato)cobalt $(Co(thd)_3)$, $Co(acac)_3$, cobalt tricarbonyl nitrosyl $(Co(CO)_3NO)$, cyclopentadienylcobalt dicarbonyl $(C_5H_5Co(CO)_2)$, cobalt amidinates, carbonyl $(CO_3)$ containing cobalt precurorsors and anhydrous cobalt nitrate $(Co(NO_3)_3)$ and derivatives thereof. Anhydrous cobalt nitrate $(Co(NO_3)_3)$ has not been commercially available but it can be synthesized, e.g., according to the instruction published by R. J. Fereday, N. Logan and D. Sutton, "Anhydrous cobalt(III) nitrate", Chem. Commun. 1968, pp. 271, the disclosure of which is included herein by reference.

Volatile iron compounds may be selected, for example, from the group consisting of, but not limited to, tris(2,2,6,6-tetramethyl-3,5-heptanedionato)iron $(Fe(thd)_3)$, bis(cyclopentadienyl)iron $((C_5H_5)_2Fe)$ and its derivatives, iron (III) acetylacetonate $(Fe(CH_3COCHCOCH_3)_3)$, iron (III) chloride $(FeCl_3)$ and iron pentacarbonyl $(Fe(CO)_5)$.

Volatile chromium compounds are selected from the group consisting of, but not limited to, tris(2,2,6,6-tetramethyl-3,5-heptanedionato)chromium $(Cr(thd)_3)$, chromyl chloride $(CrO_2Cl_2)$, bis(cyclopentadienyl)chromium $((C_5H_5)_2Cr)$ and its alkyl derivatives, bis(ethylbenzene)chromium, chromium (III) acetylacetonate $(Cr(CH_3COCHCOCH_3)_3)$ and chromium hexacarbonyl $(Cr(CO)_6)$.

Volatile nickel compounds may be selected, for example, from the group consisting of, but not limited to, Ni(EtNac-Nac)$_2$ (i.e. bis(4-N-ethylamino-3-penten-2-N-ethyliminato) nickel(II)), nickel amidinates, bis(2,2,6,6-tetramethyl-3,5-heptanedionato)nickel $(Ni(thd)_2)$, nickel carbonyl $(Ni(CO)_4)$ and its derivatives, nickel (II) hexafluoroacetylacetonate, bis (cyclopentadienyl)nickel $((C_5H_5)_2Ni)$ and its alkyl derivatives and tetrakis(trifluorophosphine)nickel (0) $(Ni(PF_3)_4)$.

Volatile ruthenium compounds may be selected, for example, from the group consisting of, but not limited to, bis(cyclopentadienyl)ruthenium, tris(2,2,6,6-tetramethyl-3,5-heptanedionato)ruthenium, 2,4-(dimethylpentadienyl) (ethylcyclopentadienyl)ruthenium, $(Ru[(CH_3)_2C_5H_5](EtCp)])$ and tris(N,N'-diisopropylacetamidinato)ruthenium (III) and their derivatives, such as bis(N,N'-diisopropylacetamidinato)ruthenium(II) dicarbonyl, bis (ethylcyclopentadienyl)ruthenium, bis (pentamethylcyclopentadienyl)ruthenium and bis(2,2,6,6-tetramethyl-3,5-heptanedionato)(1,5-cyclooctadiene) ruthenium(II). In some embodiments, the precursor is bis (ethylcyclopentadienyl) ruthenium $(Ru[EtCp]_2)$.

Volatile platinum compounds may be selected, for example, from the group consisting of, but not limited to, (trimethyl)methylcyclopentadienylplatinum(IV), platinum (II)acetylacetonato, bis(2,2,6,6-tetramethyl-3,5-heptanedionato)platinum(II) and their derivatives.

Volatile palladium compounds may be selected, for example, from the group consisting of, but not limited to, bis(hexafluoroacetylacetonate)palladium(II), Pd(acac) .sub.2, and bis(2,2,6,6-tetramethyl-3,5-heptanedionato)palladium(II) and derivates of those.

Volatile rhodium compounds may be selected, for example, from the group consisting of, but not limited to, rhodium(III)acetylacetonato, cyclopentadienyl compounds of Rh and derivates of those.

The metal precursors employed in the processes may be solid, liquid or gaseous material under standard conditions (room temperature and atmospheric pressure), provided that the metal precursor is in vapor phase before it is conducted into the reaction chamber and contacted with the substrate surface. Similarly, the oxygen-containing reactants are in vapor form when contacting the substrate.

"Pulsing" a vaporized precursor or vapor-phase oxygen source reactant onto the substrate means that the vapor is conducted into the chamber for a limited period of time. Typically, the pulsing time is from about 0.05 to 10 seconds. However, depending on the substrate type and its surface area, the pulsing time may be even higher than 10 seconds.

As an example, for a 300 mm wafer in a single wafer ALD reactor, the metal precursors are pulsed for from about 0.05 to 10 seconds, more preferably for from about 0.1 to 5 seconds and most preferably for from about 0.3 to 3.0 seconds. The oxygen-containing reactants are preferably pulsed for from about 0.05 to 10 seconds, more preferably for from about 0.1 to 5 seconds, most preferably for from about 0.2 to 3.0 seconds. However, pulsing times can be on the order of minutes in some cases. The optimum pulsing time can be readily determined by the skilled artisan based on the particular circumstances.

The mass flow rate of the metal precursor can be determined by the skilled artisan. In one embodiment, for deposition on 300 mm wafers the flow rate of the metal precursors is preferably between about 1 and 1000 sccm without limitation. The mass flow rate of the metal precursors is usually lower than the mass flow rate of the oxygen source, which is usually between about 10 and 10000 sccm without limitation, more preferably between about 10-2000 sccm and most preferably between about 10-1000 sccm.

The pulsing time and mass flow rate of the each metal precursor and each oxygen reactant can be selected independently. In some embodiments the pulsing time (and/or mass flow rates) of the first and second metal reactants is the same, while in some embodiments the pulsing times (or mass flow rates) are different. Similarly, in some embodiments the pulsing time (or mass flow rates) of the first and second oxygen sources may be the same while in other embodiments they may be different.

The pressure in the reaction chamber is typically from about 0.01 to 20 mbar, more preferably from about 1 to about 10 mbar. However, in some cases the pressure will be higher or lower than this range, as can be readily determined by the skilled artisan.

The oxygen source may be an oxygen-containing gas pulse and can be a mixture of oxygen and inactive gas, such as nitrogen or argon. In some embodiments the oxygen source may be a molecular oxygen-containing gas pulse. In some embodiments the oxygen source comprises $H_2O$. In some embodiments the oxygen source comprises oxygen in the molecule, but not metal, for example, $N_2O$, $NO_x$ and $H_2O_2$. The preferred oxygen content of the oxygen-source gas is from about 10 to 25%. Thus, one source of oxygen may be air. In some embodiments, the oxygen source is molecular oxygen. In some embodiments, the oxygen source comprises an activated or excited oxygen species. In some embodiments, the oxygen source comprises ozone. The oxygen source may be pure ozone or a mixture of ozone, molecular oxygen, and another gas, for example an inactive gas such as nitrogen or argon. Ozone can be produced by an ozone generator and it is most preferably introduced into the reaction space with the aid of an inert gas of some kind, such as nitrogen, or with the aid of oxygen. In some embodiments, ozone is provided at a concentration from about 5 vol-% to about 40 vol-%, and preferably from about 15 vol-% to about 25 vol-%. In other embodiments, the oxygen source is oxygen plasma.

As mentioned above, each of the first and second deposition sub-cycles typically comprises alternating pulses of metal precursor and a reactant comprising an oxygen source. The oxygen source pulse may be provided, for example, by pulsing ozone or a mixture of ozone and another gas into the reaction chamber. In other embodiments, ozone is formed inside the reactor, for example by conducting oxygen containing gas through an arc. In other embodiments, an oxygen containing plasma is formed in the reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of a remote plasma the pathway to the substrate can be optimized to maximize electrically neutral species and minimize ion survival before reaching the substrate.

Before starting the deposition of the film, the substrate is typically heated to a suitable growth temperature. Preferably, the growth temperature of the metal thin film is less than about 400° C., more preferably less than about 350° C. and even more preferably less than about 200° C. The preferred deposition temperature may vary depending on a number of factors such as, and without limitation, the reactant precursors, the pressure, flow rate, the arrangement of the reactor, and the composition of the substrate including the nature of the material to be deposited on. The specific growth temperature may be selected by the skilled artisan based on the particular circumstances.

The processing time depends, in part, on the thickness of the layer to be produced, the composition of the film, and the growth rate of the individual deposition sub-cycles.

In some embodiments the mixed metal oxide is deposited by ALD over a substrate surface to form a conformal thin film of between about 1 nm and about 200 nm, preferably between about 1 nm and about 50 nm in thickness, more preferably between about 1 nm and about 30 nm and most preferably between about 2 nm and about 10 nm. In some embodiments the mixed metal oxide thickness is less than 10 nm, preferably less than 5 nm. In some embodiments, the mixed metal oxide is deposited conformally over vertical and horizontal surfaces. Although described in detail below in terms of Ni/Fe and Pt/Ni alloy deposition, the method may be readily adjusted to deposit other metallic films.

For example, in some embodiments a complete ALD cycle for depositing a mixed metal oxide comprising NiO and FeO comprises a first deposition sub-cycle to deposit NiO and a second deposition sub-cycle to deposit FeO. The number of first and second deposition sub-cycles in each complete ALD cycle is selected to provide a desired concentration of Ni and Fe in the mixed metal oxide. Following deposition, the mixed metal oxide is reduced to a Ni/Fe metal alloy, as described below.

In some embodiments a complete ALD cycle for depositing a mixed metal oxide comprising NiO and Pt/PtO comprises a first deposition sub-cycle to deposit NiO and a second deposition sub-cycle to deposit Pt and/or PtO. The temperature at which the second deposition sub-cycle is carried out can be selected to form a desired amount of Pt relative to PtO. The number of first and second deposition sub-cycles in each complete ALD cycle is selected to provide a desired concentration of Ni and Pt in the mixed metal oxide. Following deposition, the mixed metal oxide is reduced to a Ni/Pt metal alloy, as described below.

In some embodiments a complete ALD cycle for depositing a mixed metal oxide comprising CoO and Pt/PtO comprises a first deposition sub-cycle deposit CoO and a second deposition sub-cycle to deposit Pt and/or PtO. The temperature at which the second deposition sub-cycle is carried out can be selected to form a desired amount of Pt relative to PtO. The number of first and second deposition sub-cycles in each complete ALD cycle is selected to provide a desired concentration of Co and Pt in the mixed metal oxide. Following deposition, the mixed metal oxide is reduced to a Co/Pt metal alloy, as described below.

In some embodiments a complete ALD cycle for depositing a mixed metal oxide comprising CuO and Pt/PtO comprises a first deposition sub-cycle to deposit CuO and a second deposition sub-cycle to deposit Pt and/or PtO. The temperature at which the second deposition sub-cycle is carried out can be selected to form a desired amount of Pt relative to PtO. The number of first and second deposition sub-cycles in each complete ALD cycle is selected to provide a desired concentration of Cu and Pt in the mixed metal oxide. Following deposition, the mixed metal oxide is reduced to a Cu/Pt metal alloy, as described below.

Other combinations of different metal oxides can be selected for the skilled artisan depending on the particular circumstances.

CVD of Metal Oxide

The skilled artisan will appreciate that the mixed metal oxide need not be deposited entirely by ALD and that other vapor deposition techniques (e.g., CVD) can also be used. In some embodiments at least one of the first metal and the second metal in the mixed metal oxide film may be deposited by CVD. CVD of nickel oxide, for example, can be conducted by known techniques, such as the provision of metal organic nickel source with an oxidizing source.

In some embodiments, one of the first or second metals is deposited by a CVD process. In some embodiments a mixed metal oxide is formed by depositing a first metal oxide by CVD and a second metal or metal oxide by CVD. In other embodiments, a first metal oxide may be deposited by ALD and a second metal or metal oxide deposited by CVD. For example, as mentioned briefly above in some embodiments the second metal may be deposited by a CVD-type process in which a metal precursor is provided to the reaction chamber such that it decomposes on the substrate. Thus, in some embodiments a mixed metal oxide is deposited by multiple ALD sub-cycles in which a first metal oxide is deposited and multiple second sub-cycles in which a metal or metal oxide is deposited by CVD. The CVD and ALD cycles may be provided at a selected ratio to obtain a mixed metal oxide film with the desired composition.

Reduction Reaction

Following deposition, the mixed metal oxide is reduced. The reduction can be conducted using a moderately reducing environment, such as in a hydrogen atmosphere. In some embodiments the mixed metal oxide is at least partially reduced in a hydrogen atmosphere. A hydrogen atmosphere comprises molecular hydrogen $H_2$, hydrogen plasma, hydrogen radicals or hydrogen atoms. Thus, in some embodiments the mixed metal oxide layer is contacted with an atmosphere comprising $H_2$, $H_2/N_2$, hydrogen-containing plasma, hydrogen radicals or hydrogen atoms. In some embodiments the atmosphere may comprise hydrazine.

In certain embodiments, the mixed metal oxide layer is contacted with one or more vapor phase reducing agents, as discussed in U.S. Pat. No. 6,921,712, the entire disclosure of which is incorporated by reference. In some embodiments the mixed metal oxide layer is contacted with one of more of $H_2$, $NH_3$, $N_2H_4$, hydrogen containing plasma, hydrogen radicals, and hydrogen atoms. In some embodiments the mixed metal oxide may be contacted with one or more reactive organic compounds, which contain at least one functional group selected from the group of alcohol (—OH), aldehyde (—CHO), and carboxylic acid (—COOH). In some embodiments the substrate is reduced in a hydrogen environment and also contacted with an organic reducing agent. In some embodiments the reducing agent is molecular hydrogen $H_2$ or a mixture comprising molecular hydrogen, such as forming gas.

The substrate containing the mixed metal oxide layer to be reduced is placed in a reaction space (if necessary), such as an ALD reaction chamber. In some embodiments the reaction space is then evacuated to vacuum. Vapor containing the desired reducing agent or agents, such as molecular hydrogen, is fed to the reaction space, optionally with the aid of an inert carrier gas, such as nitrogen, where it contacts the substrate. In some embodiments a vapor mixture is used, comprising two or more reducing agents. In some embodiments, the mixed metal oxide layer is contacted with hydrogen plasma. In some embodiments the mixed metal oxide layer is reduced by contacting it with forming gas ($H_2/N_2$). In some embodiments the mixed metal oxide layer is reduced by contacting it with $H_2$.

The reducing agent vapor is contacted with the substrate, preferably at low pressure, whereby the mixed metal oxide layer is reduced at least partly to a layer comprising two different metals. Typically the reaction space is then purged with an inert carrier gas to remove the unreacted reducing agent and the reaction products and/or by-products.

The reduction of the mixed metal oxide may be carried out in a wide temperature range, even as low as room temperature. Advantageously, the presence of the second metal (the metal with lower concentration in the mixed metal oxide) in the mixed metal oxide allows the reduction of the mixed metal oxide at a temperature that is lower than the reduction temperature for the individual metal oxide of the first metal (the metal with higher concentration in the mixed metal oxide) under equivalent conditions. Thus, in some embodiments the mixed metal oxide is reduced in a hydrogen atmosphere at a temperature that is at least 50°, at least 75° or at least 100° less than the highest reduction temperature of the individual oxide of the most abundant metal in the mixed metal oxide in a hydrogen atmosphere.

Figure 2:
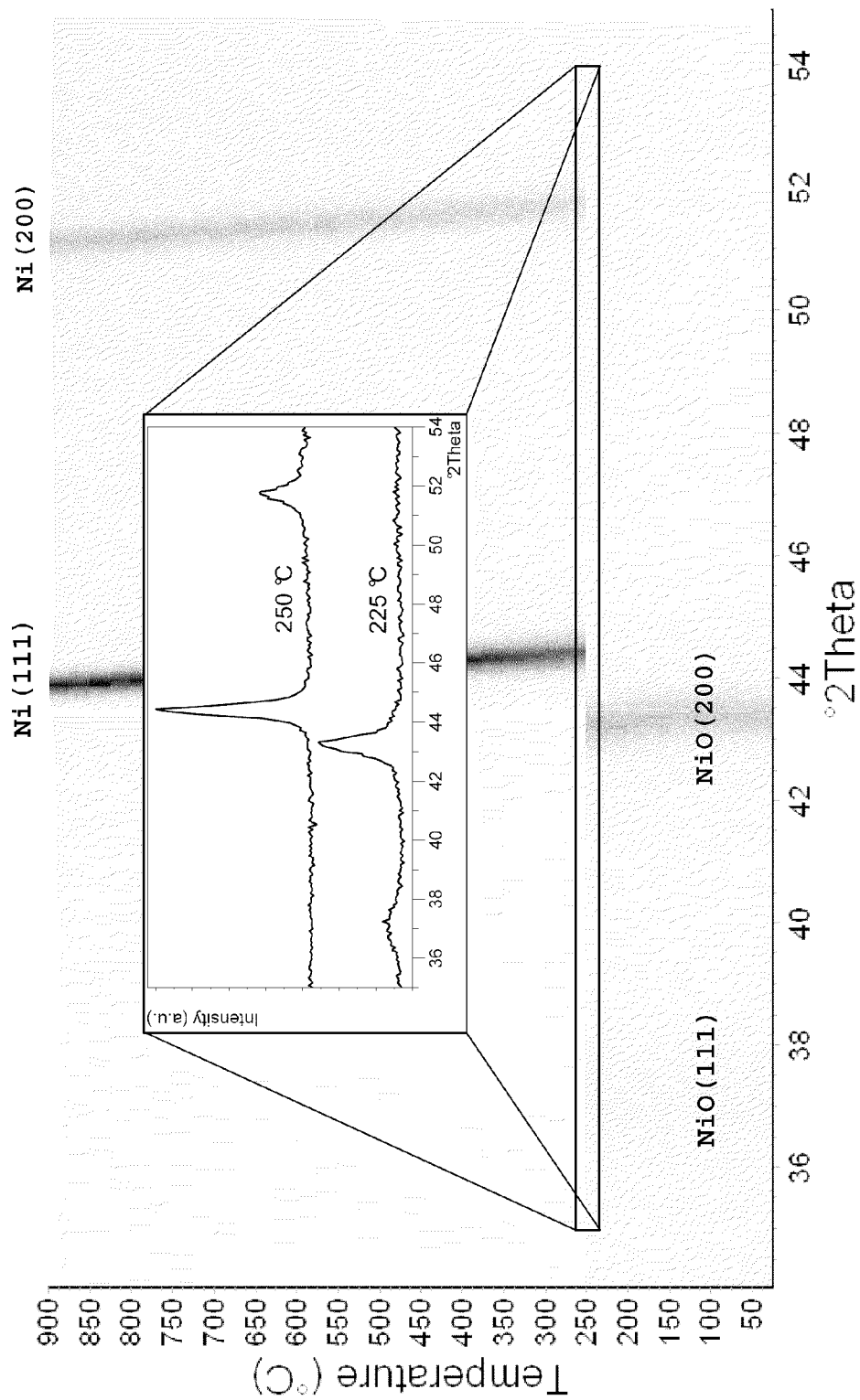
FIG. 2 shows an in-situ XRD of a NiO film annealed in forming gas.
Figure 3:
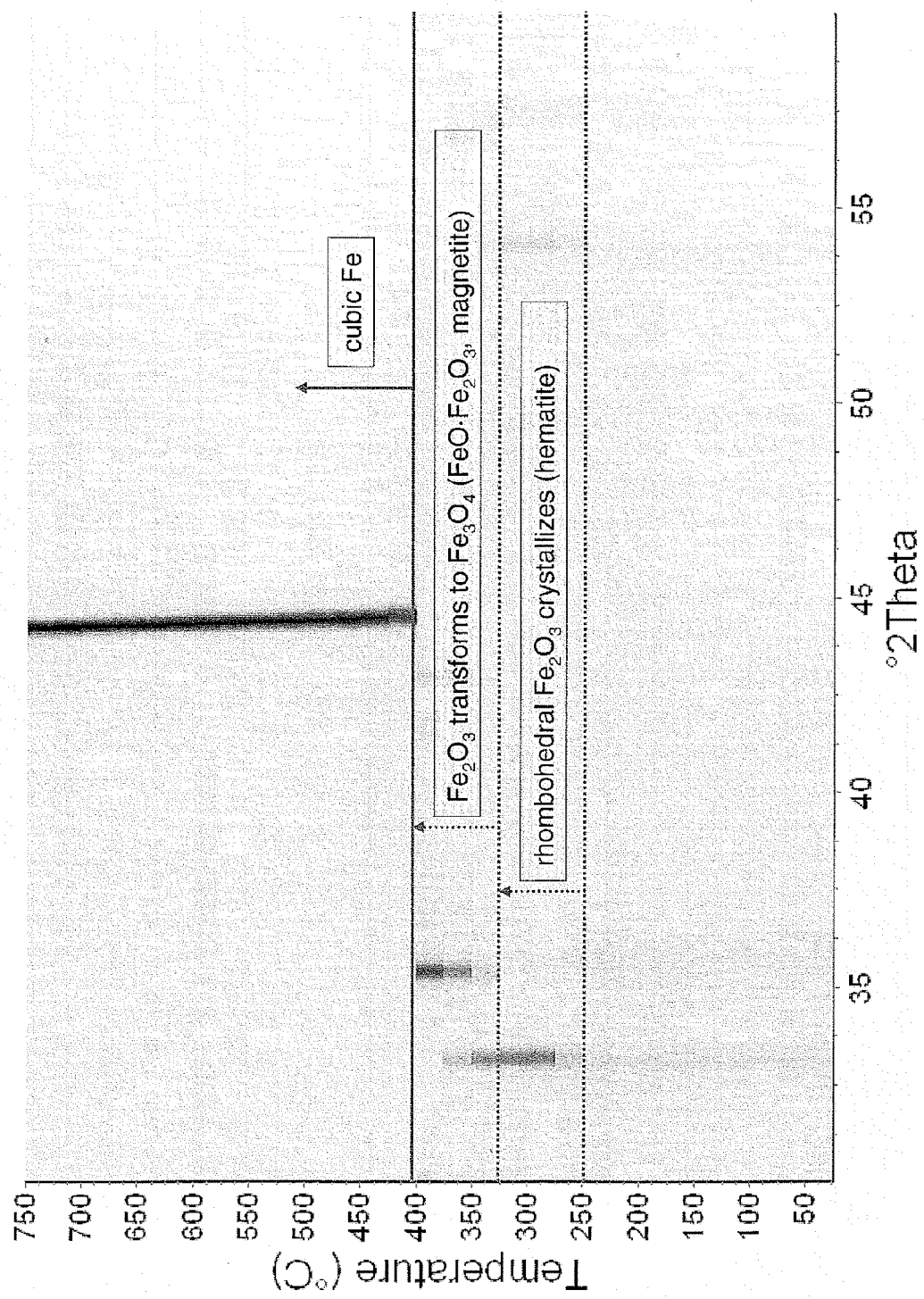
FIG. 3 shows an in-situ XRD of an $Fe_2O_3$ film annealed in forming gas.
Figure 5:
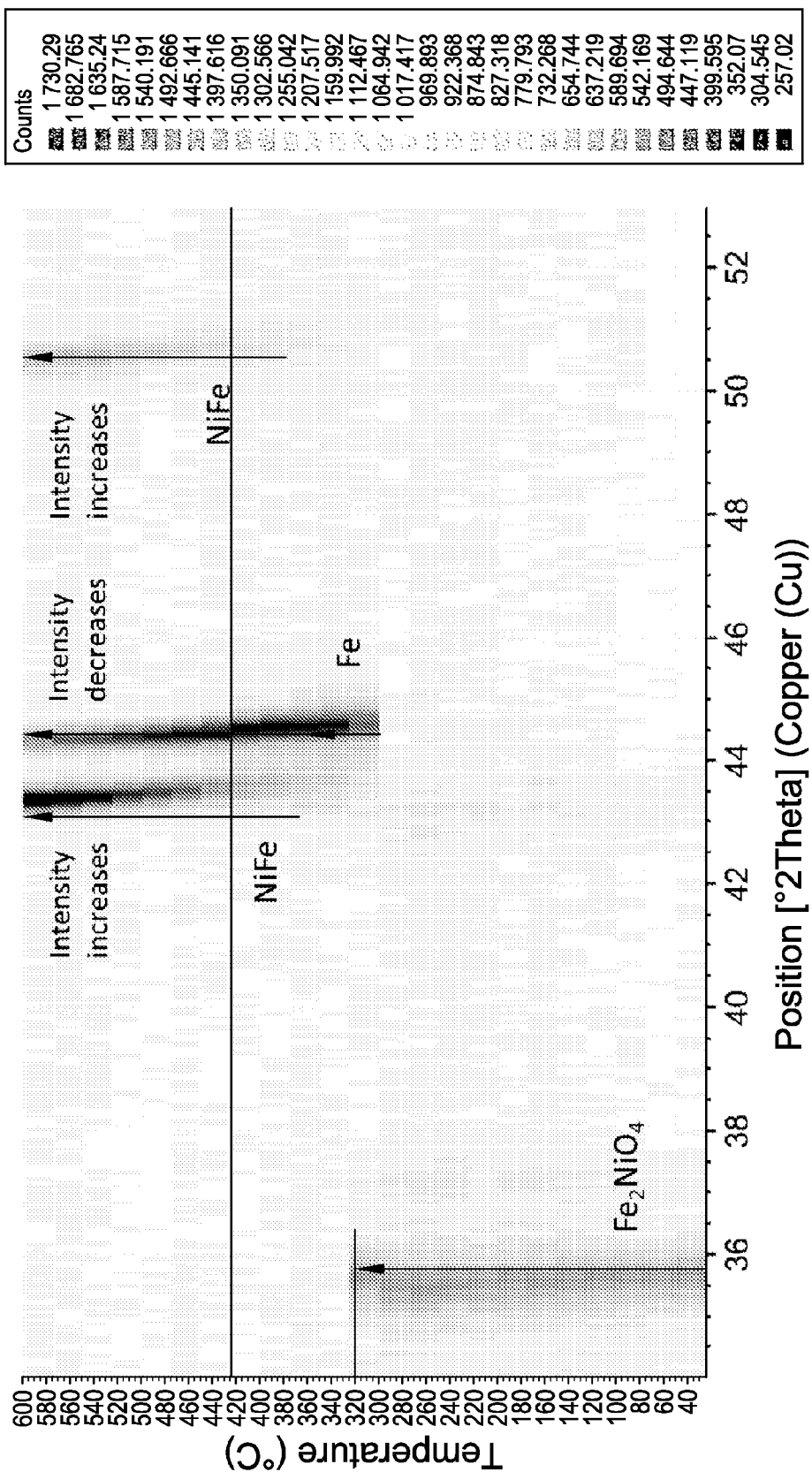
FIG. 5 shows an in-situ XRD of a $NiFe_2O_4$ film annealed in forming gas.
Figure 6:
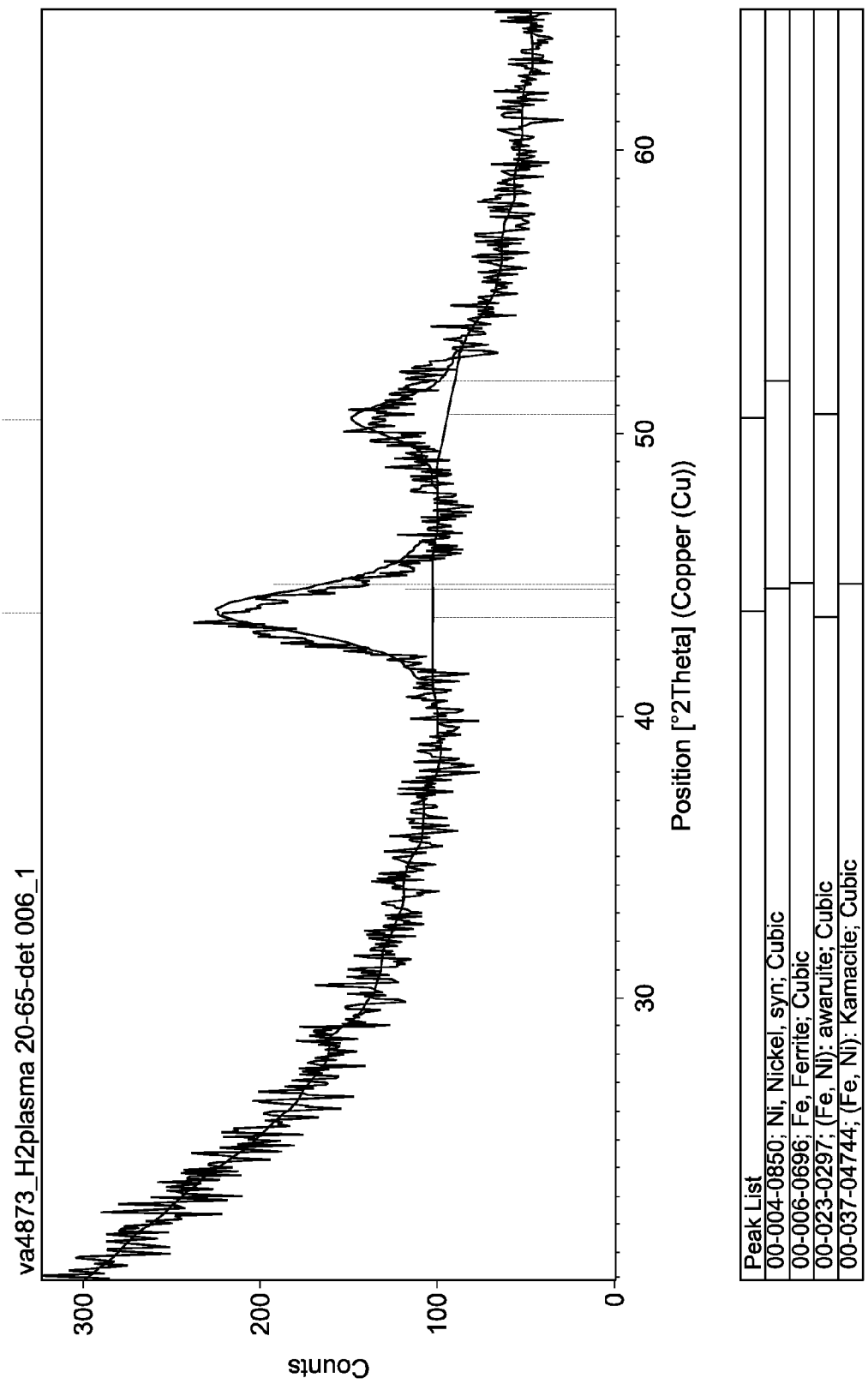
FIG. 6 shows analysis of an x-ray diffractogram of a $NiFe_2O_4$ film reduced in $H_2$ plasma at 200° C.

For example, in a hydrogen atmosphere (5% $H_2$, 95% $N_2$) NiO reduces to elemental nickel in a commercially reasonable time at about 250° C. (see FIG. 2, which shows in-situ XRD of a NiO film annealed in forming gas) while $Fe_2O_3$ reduces to $Fe_3O_4$ at 350° C. and to metallic Fe at 400° C. (see FIG. 3, which sows in-situ XRD of an $Fe_2O_3$ film annealed in forming gas). On the other hand, a crystalline $NiFe_2O_4$ film (for example as shown in the X-ray diffractogram of FIG. 4), deposited by ALD as disclosed herein, starts to form metallic Fe at 300° C. (see FIG. 5, which is an in-situ XRD of a $NiFe_2O_4$ film annealed in forming gas). This is 100° C. lower than pure $Fe_2O_3$. In addition, by reducing in hydrogen plasma, the reduction temperature of $NiFe_2O_3$ can be lowered even further. FIG. 6 shows an XRD diffractogram of a $NiFe_2O_4$ sample after 30 minutes of $H_2$-plasma treatment at 200° C. In FIG. 6, the two broad reflections can be identified as cubic NiFe (awaruite).

In addition, in a hydrogen atmosphere CuO reduces to elemental Cu at a temperature of about 270-300° C., $Co_3O_4$ reduces to Co at a temperature of about 500° C., AgO reduces to silver at about 100° C. and $Cr_2O_3$ reduces to Cr at about 1000° C.

Thus, in some embodiments, a mixed metal oxide film comprising nickel oxide and a second, different metal (at a lower concentration than the nickel) is reduced in a hydrogen atmosphere at a temperature of less than about 250° C., less than about 200° C., less than about 175° C. or less than about 150° C.

In some embodiments a mixed metal oxide film comprising iron oxide and a second, different metal (at a lower concentration than iron) is reduced in a hydrogen atmosphere at a temperature of less than about 400° C., less than about 350° C., less than about 300° C., less than about 250° C. or less than about 200° C.

In some embodiments a mixed metal oxide comprising copper oxide and a second, different metal (at a lower concentration than the copper) is reduced in a hydrogen atmosphere at a temperature of less than about 270° C., less than about 250° C., less than about 200° C. or less than about 150° C.

In some embodiments a mixed metal oxide thin film comprising cobalt oxide and a second, different metal (at a lower concentration than that of cobalt) is reduced in a hydrogen atmosphere at a temperature of less than about 500° C., less than about 400° C., less than about 300° C., or less than about 250° C.

In some embodiments a mixed metal oxide film comprising silver oxide and a second, different metal (at a lower concentration than silver) is reduced in a hydrogen atmosphere at a temperature of less than about 100° C. or less than about 50° C.

In some embodiment a mixed metal oxide film comprising chromium oxide and a second, different metal (at a lower concentration than chromium) is reduced in a hydrogen atmosphere at a temperature of less than about 1000° C., less than about 900° C., less than about 800° C., or less than about 750° C.

In some embodiments a mixed NiO and $Pt/PtO_x$ film is reduced at a temperature of about 175° C. or less, or about 150° C. or less, or about 125° C. or less, where the mixed oxide comprises less Pt than Ni.

In some embodiments a $NiFe_2O_4$ mixed oxide is deposited and reduced in a hydrogen atmosphere at a temperature of about 300° C. or less.

The processing time will vary according to a number of factors including the thickness of the layer to be reduced, the amount of each metal in the mixed metal oxide and the desired level of reduction. In some embodiments the reduction is carried out for less than about 60 minutes, less than about 30 minutes, less than about 20 minutes, less than about 10 minutes, less than about 5 minutes, less than about 3 minutes or even less than about 1 minute.

The amount of reduction may vary and can be selected by the skilled artisan in view of the particular circumstances. In some embodiments the remaining oxygen in the mixed oxide film following reduction is less than about 5%, less than about 4%, less than about 3%, less than about 2%, less than about 1%, less than about 0.5% or less than about 0.1%.

The pressure in the reaction space during reduction is preferably from about 1 mbar to about 1200 mbar, preferably below 1 atm and more preferably below 100 mbar.

Metal Silicides or Germanides

In accordance with some embodiments, a mixed metal oxide is deposited directly over silicon or germanium by ALD as described herein, followed by reduction and annealing, if necessary, to form a mixed metal silicide or mixed metal germanide. While described primarily in terms of deposition of a mixed oxide comprising nickel and platinum, the skilled artisan will recognize that other mixed oxides can be deposited, as described elsewhere herein. Initially, a substrate is provided that has exposed silicon regions. While the process is may be carried out on a bare blanket silicon structure or wafer, the "self-aligned" processes are of course more useful in applications with patterned substrates having exposed silicon and non-silicon regions. Typically silicon regions are exposed and subjected to a native oxide cleaning process prior to subsequent depositions. In addition substrates comprising exposed germanium can be used.

A layer of mixed metal oxide, for example a layer comprising nickel and platinum is deposited over the silicon, for example as described above. In some embodiments the mixed metal oxide is deposited by multiple complete ALD cycles. Each complete ALD cycle comprises one or more first deposition sub-cycles. In addition, at least one complete ALD cycle comprises one or more second deposition sub-cycles. In the first deposition sub-cycles, the substrate is alternately and sequentially contacted with vapor phase pulses of a first metal reactant and a first oxidant. One or more second deposition sub-cycles are provided before, during or immediately after the first deposition cycles. In the second deposition sub-cycles, the substrate is alternately and sequentially contacted with a second metal reactant and a second oxygen source.

In some embodiments the ALD process will comprise more of the first deposition sub-cycles than the second deposition sub-cycles. Thus, the mixed metal oxide that is formed will comprise more of the first metal than the second metal. In some embodiments at least 80%, at least 85%, at least 90%, at least 95%, at least 97%, at least 98%, at least 99% or at least 99.5% of the metal in the mixed metal oxide is the first metal. In some embodiments the first, or primary metal is Ni and the second metal is Pt. In some embodiments, preferably in embodiments where Pt is the second metal, about 30-80%, preferably about 40-60% of the metal in the mixed metal oxide is the second metal.

In some embodiments the ALD process will comprise more of the first deposition sub-cycles than the second deposition sub-cycles. Thus, the mixed metal oxide that is formed will comprise more of the first metal than the second metal. In some embodiments less than 20%, less than 10%, less than 5%, less than 3%, less than 2%, less than 1% or less than 0.5% of the metal in the mixed metal oxide is the second metal.

In order to achieve the desired concentration of the first metal and the second metal, the primary metal oxide sub-cycle and second-sub-cycle are provided at a desired ratio.

The metal content of the deposited metal oxide film can be expressed as a percentage of the overall metal content in the film, e.g. metal one/(metal one+metal two). In some embodiments the ratio in the deposited film is from about 0.001 to about 1, or about 0.01 to about 1.

Following deposition of the mixed metal oxide, the oxide is reduced, as described above, and silicidation and/or germanindation is carried out. In some embodiments, reduction takes place in a hydrogen atmosphere, for example in $H_2$ or forming gas. In some embodiments reduction is carried out at a temperature of less than about 200° C., less than about 175° C., or less than about 150° C. In some embodiments the reduction temperature is less than the reduction temperature of an oxide of the first metal, as measured in a $H_2$ atmosphere and under otherwise equivalent reducing conditions.

In some embodiments, silicidation and/or germanidation may take place concurrently with reduction of the mixed metal oxide. In other embodiments silicidation and/or germanidation may take place by annealing after reduction of the mixed metal oxide. Annealing may be carried out, for example, at 200° C. or greater, 300° C. or greater, 400° C. or greater, or even 500° C. or greater. In some embodiments annealing is carried out at 350° C. or greater. The time of the anneal may be, for example, 1, 2, 3, 4, 5, 6, 7, 8, 9, 10 or more minutes, and may adjusted to provide a film with the desired properties, such as thickness and resistivity. In some embodiments annealing is carried out in a mildly reducing atmosphere, for example in the presence of hydrogen gas or forming gas.

In some embodiments a silicon substrate is protected from oxidation during the deposition of the mixed oxide by initially depositing an interlayer over the substrate prior to depositing the mixed oxide. In some embodiments the interlayer is a Ge or Sb layer. The interlayer may be formed by any known deposition process. In some embodiments the interlayer is formed by ALD.

Subsequent to the silicidation and/or germanidation reactions, the substrate may be etched to remove uncoverted nickel or other material from the substrate surface and expose the NiSi or NiGe.

In certain embodiments, an additional conversion step may be performed to convert metal silicide from one phase to the desired phase. For example, a person of skill in the art would understand that NiSi can refer to $Ni_2Si$, NiSi, $NiSi_2$, or a combination of the three. As NiSi has a relatively lower resistivity, the skilled artisan may choose to convert any remaining NiSi to NiSi. In some embodiments, the conversion step may be carried out in the same reaction space as the metal oxide deposition step and/or the annealing step. In other embodiments, the conversion step may be performed in a separate reaction space. The conversion step may preferably be carried out at a temperature between about 200° C. and about 500° C., a pressure between about 0.01 mbar and about 10 mbar, and from about 5 s to about 1000 s.

In some embodiments a Pt-doped Ni silicide or Ni germanide is formed. A mixed $NiPtO_x$ film is deposited on a silicon or germanium substrate by an ALD process comprising one or more complete ALD cycles. At least one complete ALD cycle comprises an ALD sub-cycle for forming NiO in combination with an ALD sub-cycle for depositing $PtO_x$. The $PtO_x$ sub-cycles may be provided intermittently in the ALD process, for example prior to or after the NiO sub-cycles in each ALD cycle or in certain ALD cycles, to obtain the desired level of Pt. That is, the $PtO_x$ deposition cycle is carried out at a desired ratio to the primary NiO deposition cycle in order to obtain the mixed metal oxide film with the desired concentration of each metal.

In some embodiments instead of depositing a $PtO_x$ in the second sub-cycle, a metallic Pt film is formed. Examples for depositing a metallic Pt film are described, for example, in reference Aaltonen et al., Chemistry of Materials (2003) Volume: 15, Issue: 9, Publisher: American Chemical Society, Pages: 1924-1928 and Hämäläinen et al., Chemistry of Materials (2008) Volume: 20, Issue: 21, Pages: 6840-6846, the disclosures of which are incorporated herein in their entireties. Thus, in some embodiments, a NiO deposition sub-cycle can be used in a desired ratio with a Pt or mixed $Pt/PtO_x$ deposition sub-cycle. As mentioned above, in some embodiments the Pt deposition sub-cycle may comprise a CVD-like process wherein the platinum precursor is decomposed on the substrate.

In an exemplary embodiment, an ALD sub-cycle for depositing NiO comprises alternatingly and sequentially contacting the substrate with a Ni precursor such as Ni(EtNac-Nac)$_2$ and an oxygen reactant such as ozone. An ALD sub-cycle for forming PtO$_x$ comprises alternatingly and sequentially contacting the substrate with a platinum precursor, such as MeCpPtMe$_3$ and an oxygen reactant such as ozone In some embodiments a CVD sub-cycle for forming Pt/PtO$_x$ can be used, comprising sequentially contacting the substrate with a platinum precursor, such as MeCpPtMe$_3$ and an oxygen reactant, such as ozone or molecular oxygen, under conditions where MeCpPtMe$_3$ decomposes on the substrate. In another embodiment, a CVD sub-cycle for forming Pt/PtO$_x$ comprises simultaneously contacting the substrate with a platinum precursor, such as MeCpPtMe$_3$ and an oxygen reactant, such as ozone or molecular oxygen, under conditions where MeCpPtMe$_3$ decomposes on the substrate.

Following deposition, the mixed NiO/PtO$_x$ film is reduced. In some embodiments, the mixed NiO/PtO$_x$ film is reduced in a hydrogen atmosphere at a temperature of less than about 250° C., less than about 200° C. or less than about 150° C. In some embodiments the NiO/PtO$_x$ film is reduced by contacting the mixed oxide with an atmosphere comprising H$_2$ at a temperature of about 150° C. to about 175° C.

In some embodiments metal silicide or germinide may be formed simultaneously with the reduction process. In other embodiments annealing to form metal silicide or germinide is carried out following the reduction, thereby forming Pt doped NiSi or NiGe.

Deposition of Ni/Fe Alloys

In accordance with some embodiments, Ni/Fe alloy films are formed by depositing a mixed oxide comprising Ni and Fe by ALD, essentially as described above, and subsequently reducing the mixed metal oxide. Ni/Fe alloys find use, for example in magnetic heads of hard disk drives. However, in magnetic head applications, there is usually an upper temperature limit of about 200 to 250° C., which restricts the methods by which the Ni/Fe alloys can be formed. By depositing a mixed metal alloy comprising Ni and Fe using the methods described herein, both the deposition temperature and the reduction temperature can be maintained below this threshold. In addition, the ALD process allows for formation of highly conformal Ni/Fe alloy films.

In some embodiments a layer of mixed metal oxide comprising nickel and iron is deposited on a substrate by multiple ALD cycles, as described above. Each complete ALD cycle comprises one or more first deposition sub-cycles. In addition, at least one complete ALD cycle comprises one or more second deposition sub-cycles. In the first deposition sub-cycles, the substrate is alternately and sequentially contacted with vapor phase pulses of a first metal reactant comprising Ni, such as Ni(EtNacNac)$_2$, and a first oxidant, such as ozone or oxygen containing plasma, radicals or oxygen atoms. One or more second deposition sub-cycles are provided before, during or immediately after the first deposition cycles. In the second deposition sub-cycles, the substrate is alternately and sequentially contacted with a second metal reactant comprising Fe such as Cp$_2$Fe and a second oxygen source, such as ozone or oxygen containing plasma, radicals or oxygen atoms. Both first and second deposition sub-cycles are performed at a reaction temperature from about 100° C. to about 300° C., or, in some embodiments from about 150° C. to about 225° C. In some embodiments the first and second deposition sub-cycles are performed in the same reactor.

In some embodiments the nickel source is bis(4-N-ethylamino-3-penten-2-N-ethyliminato)nickel(II). In some embodiments the Fe reactant is Cp$_2$Fe or derivative thereof. In some embodiments the Fe reactant is Fe(acac)$_2$. In some embodiments the Fe reactant is Fe-alkoxide, such as iron(III) tert-butoxide (Fe$_2$(O$^t$Bu)$_6$). The fist and/or second oxygen source may be, for example, O$_3$ or oxygen containing plasma, radicals or oxygen atoms or H$_2$O.

Deposition preferably is carried out at a temperature of less than about 250° C., more preferably less than about 200° C. In some embodiments, the ALD process is carried out at a temperature of about 175° C.

In some embodiments, the ratio of first deposition sub-cycles (depositing Ni) to second deposition sub-cycles (depositing Fe) in the ALD process is from about 1:10 to about 2:1, preferably from 1:5 to about 1:1 and more preferably from about 1:5 to about 1:2. In some embodiments the ratio of sub-cycles is tuned so that the end product have from about 20 at-% to about 30 at-% Ni of metal concentrations.

Following deposition of a nickel oxide film of a desired thickness, the film is reduced to a nickel/iron alloy. In some embodiments the Ni/Fe film is reduced in a hydrogen atmosphere, such as in H$_2$ or in forming gas. In some embodiments the Ni/Fe film is reduced in H$_2$-plasma. Reduction preferably take place at less than about 250° C., more preferably less than about 200° C. In some embodiments, the ALD process is carried out at a temperature of about 175° C. In some embodiments reduction is carried out at a temperature of about 200° C.

EXAMPLE 1

Thin films were deposited in a Pulsar 2000 prototype reactor (F-200) using Ni(EtNacNac)$_2$ (source temp. 120° C.), MeCpPtMe$_3$ (source temp 55° C.) and O$_3$ (100 sccm, ~200 g/Nm$^3$) as precursors.

Figure 7A:
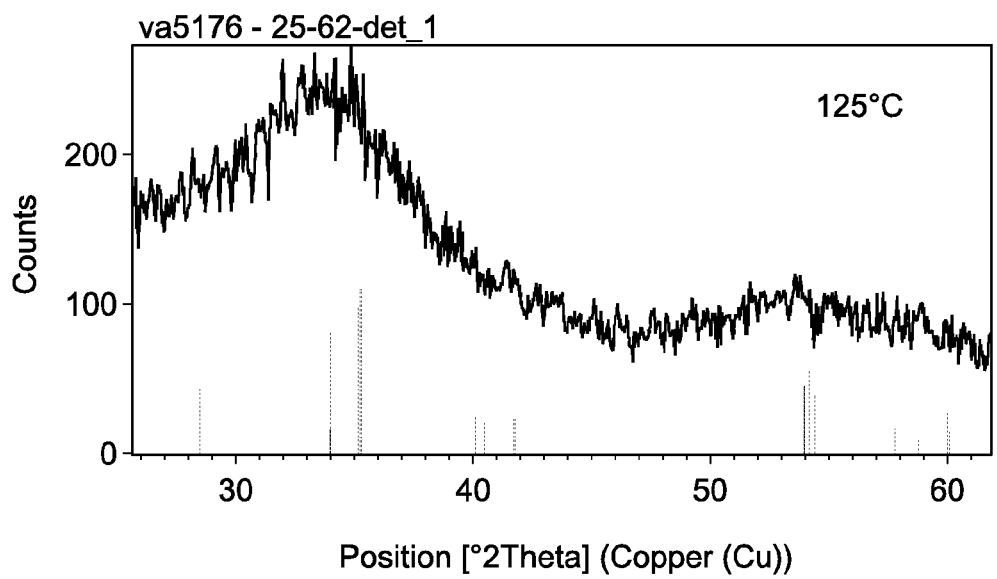
FIG. 7A shows analysis of an XRD of a thin film deposited by ALD from $MeCpPtMe_3$ and $O_3$ at 125° C.
Figure 7B:
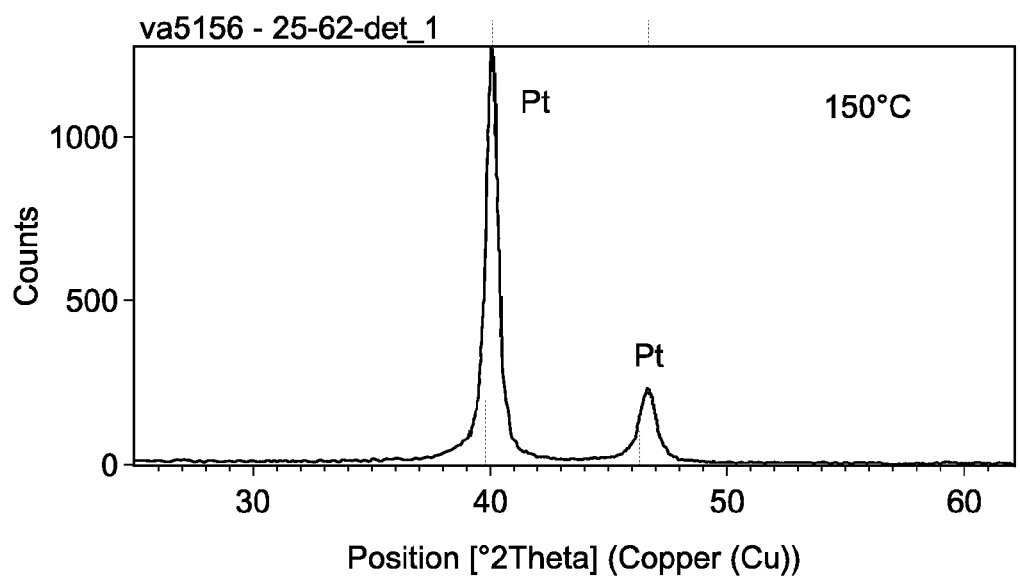
FIG. 7B shows analysis of an XRD of a thin film deposited by ALD from $MeCpPtMe_3$ and $O_3$ at 150° C.

ALD of Pt and PtO$_x$ was studied at 125-200° C. using MeCpPtMe$_3$ and O$_3$ as precursors. At 125° C. an amorphous (FIG. 7A) film with a good thickness and sheet resistance uniformity was produced. After 500 cycles the sheet resistance was 173 Ω/□ with 3σ(nonuniformity)=2.13%. The growth rate was 0.27 Å/cycle and film density 11.8 g/cm$^3$ indicating that the film was PtO$_x$. At 150° C. on the other hand a metallic Pt film was produced (FIG. 7B). The growth rate was 0.53 Å/cycle (close to 2× vs. PtO$_x$) and film density close to ~21 g/cm$^3$. Film resistivity was approximately 20 μΩcm. A Pt film was produced also at 200° C. but the thickness uniformity was not as good as at 150° C.

NiO and Pt processes were mixed in various ratios to obtain NiPtO$_x$ films with different compositions at a deposition temperature of 150° C. (see Table 1 for details). Each complete mixed oxide deposition cycle comprised one or more Ni oxide cycles (subcycles) and one or more Pt cycles (subcycles). The Ni oxide subcycle comprised alternating pulses of Ni(EtNacNac)$_2$ and O$_3$ and the Pt subcycle comprised alternating pulses of MeCpPtMe$_3$ and O$_3$. For example, the film with 3 at. % Pt was deposited using a sequence 200× (6Pt+1Ni). The pulse and purge times were 1 s and 4 s, respectively, for the Ni(EtNacNac)$_2$+O$_3$ sub-cycles and 3 s and 6 s, respectively, for the MeCpPtMe$_3$+O$_3$ sub-cycles. Reduction was studied using a PANalytical X'Pert Pro MPD diffractometer and an AntonPaar oven under a forming gas (5/95% H$_2$/N$_2$) atmosphere (total pressure approximately ~1 atm).

Figure 8:
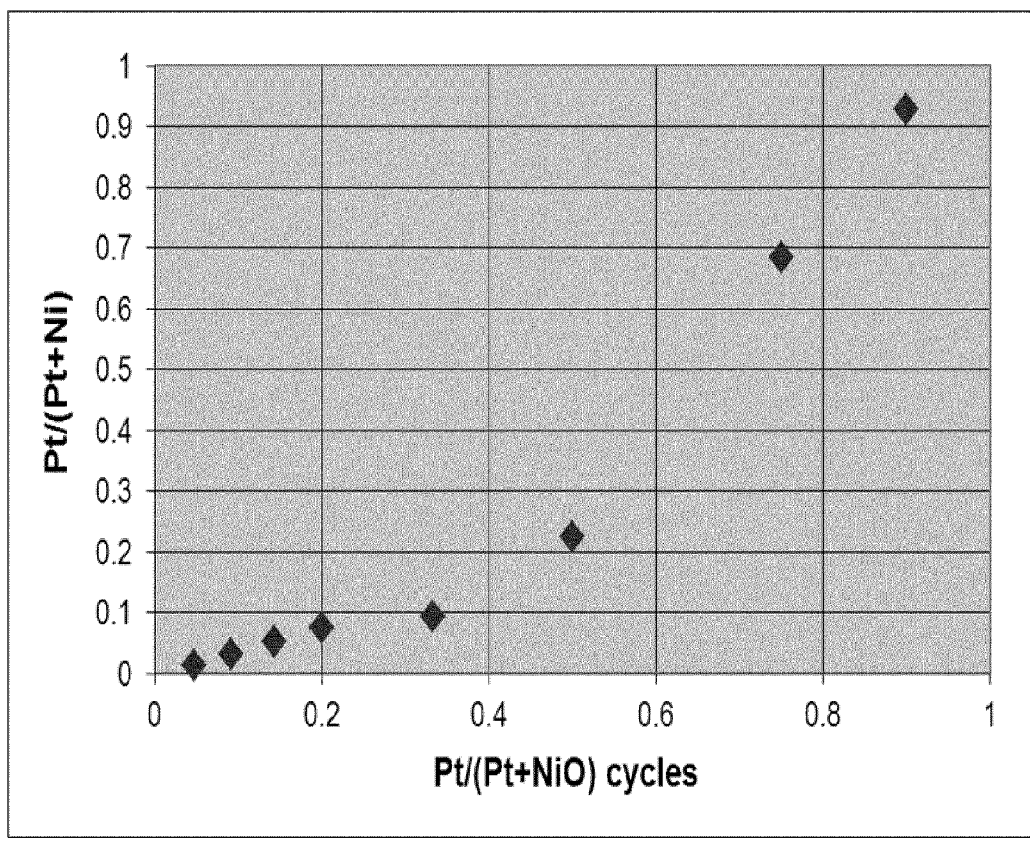
FIG. 8 illustrates platinum content of a nickel platinum oxide film as a function of the $Pt/(Pt^+ NiO)$ cycle ratio.
Figure 9A:
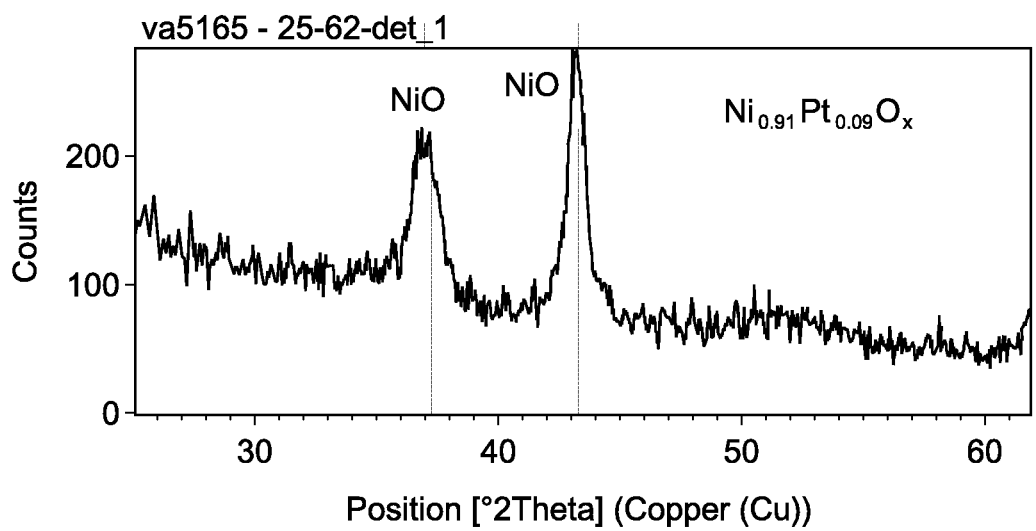
FIG. 9A shows analysis of an x-ray diffractogram of a $Ni_{0.91}Pt_{0.09}O_x$ film.
Figure 9B:
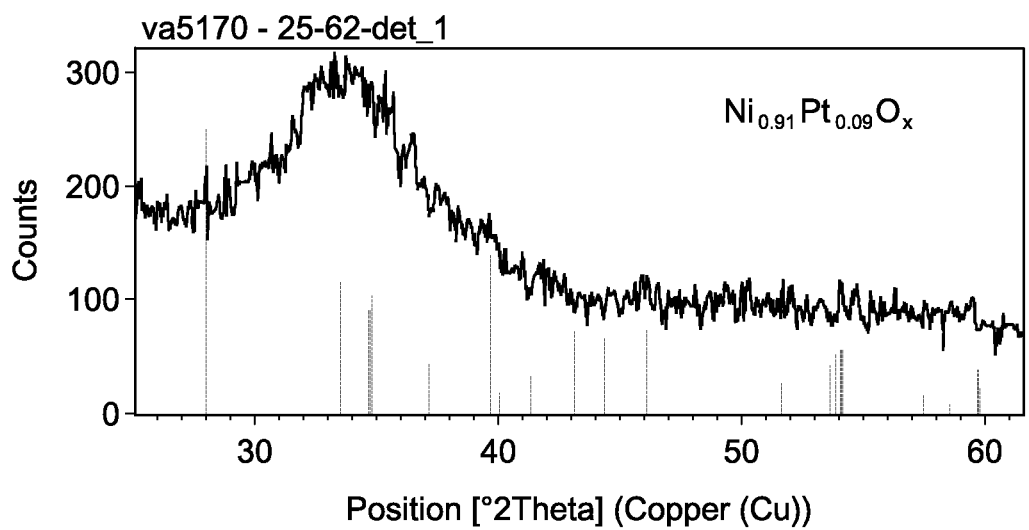
FIG. 9B shows analysis of an x-ray diffractogram of a $Ni_{0.31}Pt_{0.69}O_x$ film.

Metal ratios were measured using EDX to determine Pt content as a function of Pt/(Pt+NiO) cycle ratios (FIG. 8). It was found that the whole composition range can be covered but the growth behavior changes at approx. 0.4 Pt/(Pt+NiO) cycle ratio. With higher Pt/(Pt+NiO) cycle ratios the Pt content dependence is linear. XRD-diffractograms taken from both growth regions are shown in FIG. 9. The $Ni_{0.91}Pt_{0.09}O_x$ film (FIG. 9A) shows NiO reflections and $Ni_{0.31}Pt_{0.69}O_x$ (FIG. 9B) appears amorphous or weakly crystalline.

Figure 10:
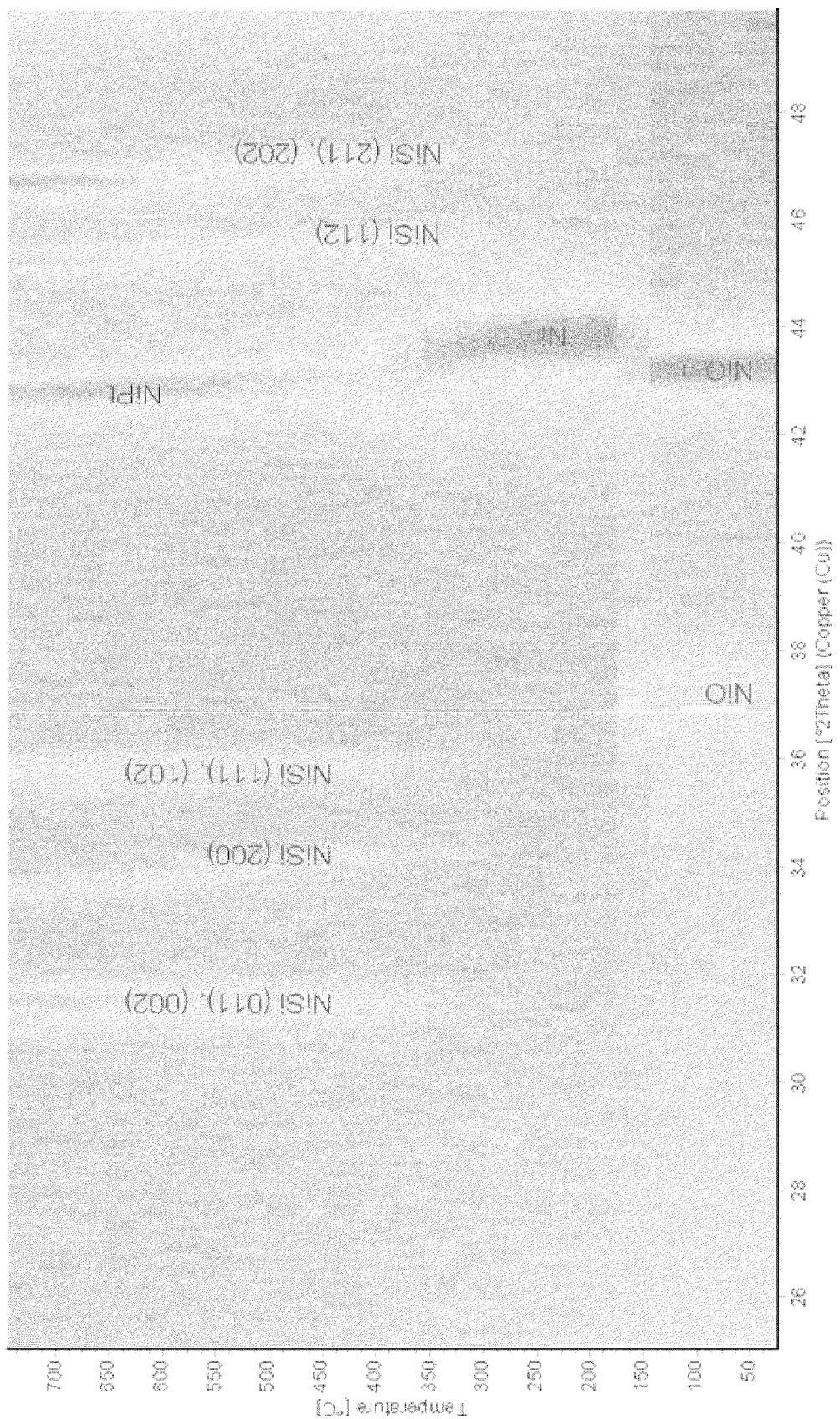
FIG. 10 shows an in-situ XRD of an $Ni_{0.95}Pt_{0.05}O_x$/Ge/Si film stack annealed in forming gas.
Figure 11:
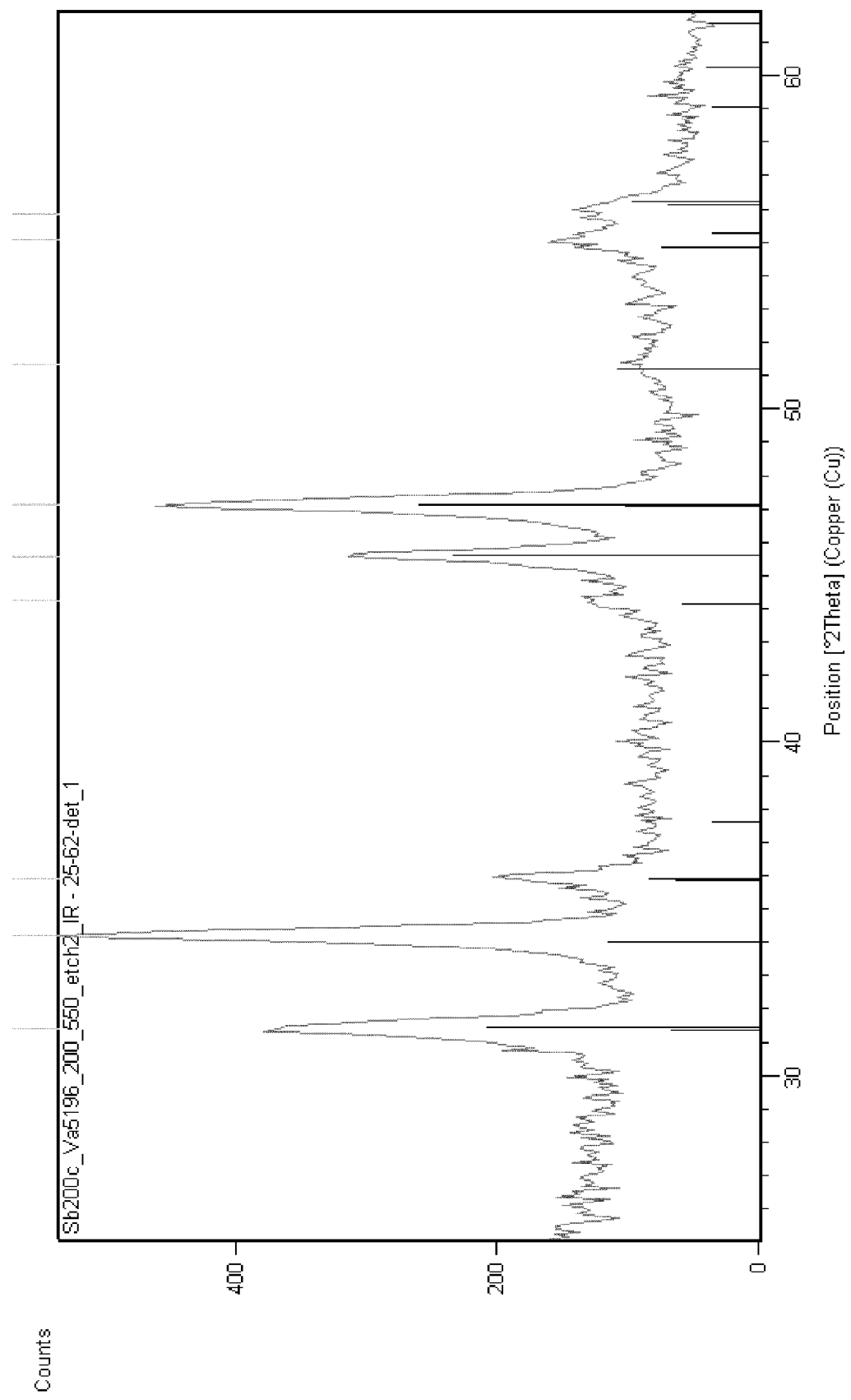
FIG. 11 shows analysis of an x-ray diffractogram of a $Ni_{0.95}/Pt_{0.05}O_x$/Sb/Si film stack annealed in forming gas at 550° C., after SPM etching.

As mentioned above, when using oxide layers as metal sources for silicidation reactions the Si substrate can be protected from oxidizing agents to reduce $SiO_x$ formation. This can be done, for example, using interlayers of Ge or Sb. Silicidation of a $Ni_{0.95}Pt_{0.05}O_x$ film was studied using 4 nm Ge/Si and 13 nm Sb/Si structures. FIG. 10 shows an in-situ XRD experiment of $Ni_{0.95}Pt_{0.05}O_x$ deposited on a Ge/Si film stack and annealed in forming gas. Nickel monosilicide forms at roughly 300-350° C. and is stable at least up to 750° C. FIG. 11 shows an XRD pattern of $Ni_{0.95}Pt_{0.05}O_x$ deposited on an Sb/Si film stack and annealed at 550° C. in forming gas. All the reflections observed belong to the NiSi phase.

Utilizing $H_2$ plasma in the reducing atmosphere lowered the reduction temperature even further. FIG. 6 illustrates an XRD diffractogram of an $NiFe_2O_4$ sample after 30 minutes of $H_2$-plasma treatment at 200° C. The two broad reflections were identified as cubic NiFe (awaruite).

Though primarily described in the context of self-aligned silicidation or germanidation over patterned transistors, it will be apparent to the skilled artisan that the above described processes will be beneficial at any of a number of integrated circuit fabrication steps and in other contexts, and that the deposition processes will find use in a wide variety of contexts.

Similarly, various modifications, omissions and additions may be made to the methods and structures described above without departing from the scope of the invention. All such modifications and changes are intended to fall within the scope of the invention, as defined by the appended claims.

TABLE 1

Deposition parameters, growth rates and metal ratios of NiPtOx films prepared by ALD.

| Complete Cycles | Ni subcycles | Pt subcycles | Pt/(Pt + Ni) cycles | total cycles | growth rate (Å/cycle) | EDX-data | | |
|---|---|---|---|---|---|---|---|---|
| | | | | | | Pt at. % | Ni at. % | Pt/(Pt + Ni) |
| 20 | 100 | 1 | 0.01 | 2020 | — | <0.01 | 0.50 | |
| 40 | 50 | 1 | 0.02 | 2040 | — | <0.01 | 0.50 | |
| 100 | 20 | 1 | 0.05 | 2100 | 0.22 | 0.01 | 0.50 | 0.01 |
| 200 | 10 | 1 | 0.09 | 2200 | 0.23 | 0.02 | 0.49 | 0.03 |
| 200 | 6 | 1 | 0.14 | 1400 | 0.19 | 0.03 | 0.49 | 0.05 |
| 250 | 4 | 1 | 0.20 | 1250 | 0.20 | 0.04 | 0.48 | 0.07 |
| 400 | 2 | 1 | 0.33 | 1200 | 0.18 | 0.05 | 0.48 | 0.09 |
| 500 | 1 | 1 | 0.50 | 1000 | 0.18 | 0.13 | 0.44 | 0.22 |
| 500 | 1 | 2 | 0.67 | 1500 | — | 0.21 | 0.39 | 0.35 |
| 150 | 1 | 3 | 0.75 | 600 | — | 0.52 | 0.24 | 0.69 |
| 50 | 1 | 9 | 0.90 | 500 | — | 0.87 | 0.07 | 0.93 |

EXAMPLE 2

Thin nickel iron oxide films were deposited in a Pulsar ALCVD prototype reactor (F-200) or in an F-450 reactor using bis(4-N-ethylamino-3-penten-2-N-ethyliminato)nickel(II), $Cp_2Fe$ and $O_3$ as precursors. NiO and $Fe_2O_3$ subcycles were mixed (1xNiO+4x$Fe_2O_3$) to obtain a crystalline $NiFe_2O_4$ film at a deposition temperature of 175° C. Crystallization and reduction were studied using a PANalytical X'Pert Pro MPD diffractometer and an AntonPaar oven under a forming gas (5% $H_2$/95% $N_2$) atmosphere.

Figure 4:
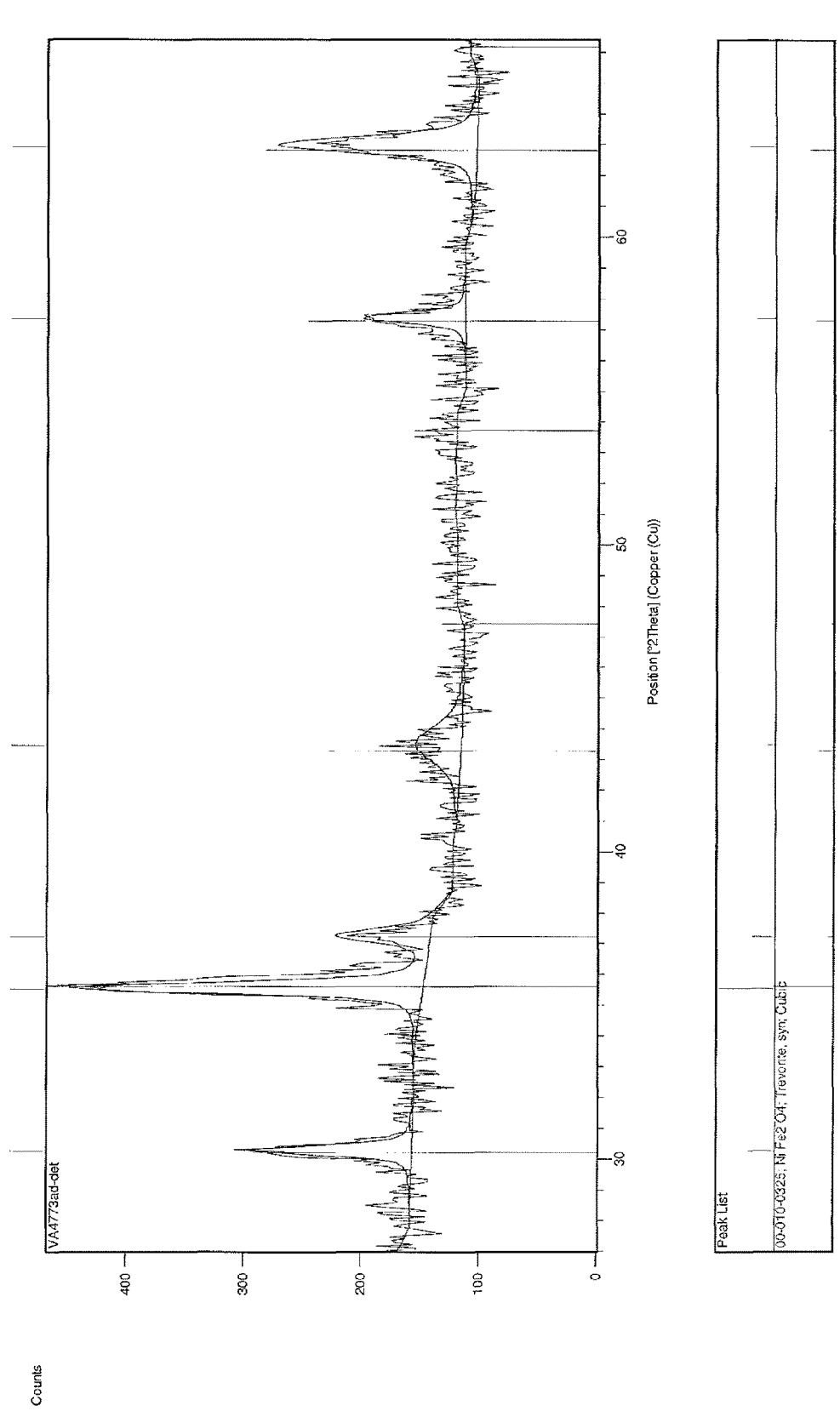
FIG. 4 shows analysis of an x-ray diffractogram of a NiO/$Fe_2O_3$ mixed oxide prepared by ALD.

A nickel containing mixed oxide ($NiFe_2O_4$) was deposited an found to be reduced to metallic Fe and NiFe at a much lower temperature than the temperature required for reduction of $Fe_2O_3$ to metallic Fe. Using thermal reduction in the presence of forming gas (5% H2/95% N2), pure NiO reduces to metallic Ni at 250° C. (see FIG. 2, which is an in-situ XRD of an NiO film annealed in forming gas). Pure $Fe_2O_3$ reduces first to $Fe_3O_4$ at 350° C. and to metallic Fe at 400° C. (see FIG. 3, which is an in-situ XRD of an $Fe_2O_3$ film annealed in forming gas). A crystalline $NiFe_2O_4$ film was deposited by ALD. FIG. 4 is an XRD of this $NiO/Fe_2O_3$ mixed oxide, where all reflections can be identified as cubic $NiFe_2O_4$ (PDF 00-010-0325, trevorite). The $NiFe_2O_4$ film starts to form metallic Fe at 300° C., as illustrated in FIG. 5, which shows an XRD of the $NiFe_2O_4$ film annealed in forming gas. This is a temperature that is 100° C. lower than the reducing temperature for pure $Fe_2O_3$. Increasing NiFe reflections were also seen in this sample when the temperature was raised further.

We claim:

1. A method for forming a metallic film comprising two different metals on a substrate in a reaction space, the method comprising:
  depositing a mixed metal oxide comprising a first metal and a second metal on the substrate, wherein the first metal is different from the second metal and the mixed metal oxide comprises a greater concentration of the first metal than the second metal and wherein the mixed metal oxide film is not a film in which distinct and separate layers of metal oxides are observable; and
  reducing the mixed metal oxide by heating the substrate in a hydrogen atmosphere,
  wherein the first metal is selected from the group consisting of Ni, Fe, Co, Cu, Ag, Cr, V, Mn, Zn, Sn, Pb, Bi, In and Cd; and
  wherein the second metal is selected from the group consisting of Pt, Ni, Pd, Rh, Ru, and Co.

2. The method of claim 1, wherein the hydrogen atmosphere comprises $H_2$.

3. The method of claim 1, wherein the hydrogen atmosphere comprises hydrogen plasma.

4. The method of claim 1, wherein the hydrogen atmosphere comprises hydrogen radicals or hydrogen atoms.

5. A method for forming a metallic film comprising two different metals on a substrate in a reaction space, the method comprising:
  depositing a mixed metal oxide comprising a first metal and a second metal on the substrate, wherein the first metal is different from the second metal and the mixed metal oxide comprises a greater concentration of the first metal than the second metal and wherein the mixed metal oxide film is not a film in which distinct and separate layers of metal oxides are observable; and reducing the mixed metal oxide by heating the substrate in a hydrogen atmosphere, wherein the first metal is Ni and the second metal is Pt.

6. The method of claim 5, wherein the mixed metal oxide is $PtNiO_x$.

7. The method of claim 6, wherein the mixed metal oxide is reduced by heating to a temperature of about 150° C. to about 175° C.

8. A method for forming a metallic film comprising two different metals on a substrate in a reaction space, the method comprising:

depositing a mixed metal oxide comprising a first metal and a second metal on the substrate, wherein the first metal is different from the second metal and the mixed metal oxide comprises a greater concentration of the first metal than the second metal and wherein the mixed metal oxide film is not a film in which distinct and separate layers of metal oxides are observable; and reducing the mixed metal oxide by heating the substrate in a hydrogen atmosphere, wherein the first metal is Fe and the second metal is Ni.

9. The method of claim 8, wherein the mixed metal oxide is $NiFe_2O_4$.

10. The method of claim 1, wherein the first metal is selected from Ni, Fe, Co, Cu and Ag.

11. The method of claim 1, wherein depositing comprises an atomic layer deposition process.

12. The method of claim 11, wherein the atomic layer deposition process comprises a first sub-cycle in which the substrate is alternately and sequentially contacted with a first reactant comprising the first metal and a first oxygen source.

13. The method of claim 12, wherein the first oxygen source is $O_3$.

14. The method of claim 12, wherein the atomic layer deposition process additionally comprises a second sub-cycle in which the substrate is alternately and sequentially contacted with a second reactant comprising the second metal and a second oxygen source.

15. The method of claim 14, wherein the first and second sub-cycles are repeated a predetermined number of times to obtain a mixed metal oxide thin film with a desired concentration of the first metal and a desired concentration of the second metal.

16. The method of claim 1, wherein the ratio of the second metal to the first metal in the mixed metal oxide is less than 1:1.

17. The method of claim 16, wherein the ratio of the second metal to the first metal is less than 1:10.

18. The method of claim 1, wherein the mixed metal oxide film is reduced until the amount of oxygen in the film is less than about 5%.

19. The method of claim 1, wherein the mixed metal oxide film is reduced for less than about 10 minutes.

20. A method for silicidation comprising:

providing a substrate having at least one exposed silicon region;

forming a metal oxide thin film comprising a first metal and a different second metal over the exposed silicon region by at least one complete cycle of an atomic layer deposition (ALD) process, wherein the metal oxide thin film is not a film in which distinct and separate layers of metal oxides are observable, and wherein one complete cycle comprises:

contacting the substrate with a first metal reactant;

contacting the substrate with a first oxygen source;

contacting the substrate with a second metal reactant; and contacting the substrate with a second oxygen source;

after forming, reducing the metal oxide thin film to a metallic film by heating the substrate in a hydrogen atmosphere; and annealing to form a metal silicide layer comprising the first and second metals.

21. A method of forming a mixed metal layer comprising nickel and iron on a substrate comprising:

depositing a mixed metal oxide comprising nickel and iron on the substrate by a vapor deposition process wherein the mixed metal oxide is not a film in which distinct and separate layers of metal oxides are observable; and reducing the mixed metal oxide at a temperature of less than about 300° C. in a hydrogen atmosphere.

22. The method of claim 21, wherein the mixed metal oxide is reduced at a temperature of less than about 250° C.

23. The method of claim 22, wherein the mixed metal oxide is reduced at a temperature of less than about 150° C.

24. The method of claim 21, wherein the hydrogen atmosphere comprises forming gas.

25. The method of claim 21, wherein the hydrogen atmosphere comprises $H_2$.

26. The method of claim 21, wherein depositing comprises an atomic layer deposition process.

27. The method of claim 26, wherein the atomic layer deposition process comprises multiple complete atomic layer deposition cycles, each complete ALD cycle comprising a first sub-cycle and a second sub-cycle, wherein the first sub-cycle comprises:

contacting the substrate with a first vapor-phase metal reactant comprising nickel; and contacting the substrate with a first oxygen source; and wherein the second sub-cycle comprises:

contacting the substrate with a second vapor phase metal reactant comprising iron; and contacting the substrate with a second oxygen source.

28. The method of claim 27, wherein the first vapor phase metal reactant is $Ni(EtNacNac)_2$ or bis(4-N-ethylamino-3-penten-2-N-ethyliminato)nickel(II).

29. The method of claim 27, wherein the first oxygen source is selected from ozone, oxygen containing plasma, oxygen radicals and atomic oxygen.

30. The method of claim 27, wherein the second vapor phase metal reactant is $CP_2Fe$ or an iron alkoxide.

31. A method of forming a metal layer comprising nickel and iron comprising depositing $NiFe_2O_4$ by a vapor deposition process and reducing the $NiFe_2O_4$ in a hydrogen atmosphere at a temperature of less than about 300° C.

32. The method of claim 31, wherein the $NiFe_2O_4$ is deposited by an atomic layer deposition process.

33. A method of forming a mixed metal comprising nickel and platinum comprising depositing a nickel platinum oxide film by a vapor deposition process and reducing the nickel platinum oxide film in a hydrogen atmosphere at a temperature of less than about 200° C.

34. The method of claim 33, wherein the nickel platinum oxide film comprises about 40% to about 60% platinum.

35. The method of claim 33, wherein the vapor deposition process comprises multiple cycles of a nickel oxide deposition process and multiple cycles of a platinum oxide deposition process.

36. The method of claim 35, wherein the nickel oxide deposition process comprises contacting a substrate with a first metal reactant comprising nickel and a second oxygen reactant.

37. The method of claim 36, wherein the first metal reactant comprises Ni(EtNacNac)$_2$.

38. The method of claim 35, wherein the platinum oxide deposition cycle comprises contacting the substrate with a second metal reactant comprising platinum and a second oxygen reactant.

39. The method of claim 38, wherein the second metal reactant comprises MeCpPtMe$_3$.

40. The method of claim 33, wherein the hydrogen atmosphere comprises H$_2$.

* * * * *